(12) United States Patent
Anderson et al.

(10) Patent No.: US 9,006,099 B2
(45) Date of Patent: Apr. 14, 2015

(54) SEMICONDUCTOR DEVICE AND METHOD OF FORMING A POWER MOSFET WITH INTERCONNECT STRUCTURE SILICIDE LAYER AND LOW PROFILE BUMP

(75) Inventors: Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 119 days.

(21) Appl. No.: 13/156,281

(22) Filed: Jun. 8, 2011

(65) Prior Publication Data

US 2012/0313147 A1     Dec. 13, 2012

(51) Int. Cl.
*H01L 23/485*     (2006.01)
*H01L 23/482*     (2006.01)
(Continued)

(52) U.S. Cl.
CPC .......... *H01L 23/485* (2013.01); *H01L 23/4824* (2013.01); *H01L 21/76895* (2013.01); *H01L 21/28518* (2013.01); *H01L 29/456* (2013.01); *H01L 29/665* (2013.01); *H01L 29/7835* (2013.01); *H01L 2924/13091* (2013.01); *H01L 2224/05027* (2013.01); *H01L 2224/05094* (2013.01); *H01L 24/03* (2013.01); *H01L 24/05* (2013.01); *H01L 24/11* (2013.01); *H01L 24/13* (2013.01); *H01L 2224/03464* (2013.01); *H01L 2224/05022* (2013.01); *H01L 2224/05096* (2013.01); *H01L 2224/05111* (2013.01); *H01L 2224/05124* (2013.01); *H01L 2224/05139* (2013.01); *H01L 2224/05144* (2013.01); *H01L 2224/05155* (2013.01); *H01L 2224/05558* (2013.01); *H01L 2224/05562* (2013.01); *H01L 2224/05573* (2013.01); *H01L 2224/05611* (2013.01); *H01L 2224/05624* (2013.01); *H01L 2224/05639* (2013.01);
(Continued)

(58) Field of Classification Search
CPC ....................................................... H01L 23/485
USPC .................................. 438/106, 614, 622, 655
See application file for complete search history.

(56) References Cited

U.S. PATENT DOCUMENTS 5,519,658 A     5/1996    Uda et al.
5,970,380 A *   10/1999    Lee ................................ 438/682
(Continued)

FOREIGN PATENT DOCUMENTS

JP     2000-260801     9/2000
JP     2002-33393     1/2002
(Continued)

*Primary Examiner* — Marcos D Pizarro Crespo
(74) *Attorney, Agent, or Firm* — Robert D. Atkins; Atkins and Associates, P.C.

(57) ABSTRACT

A semiconductor device has a substrate with a source region and a drain region formed on the substrate. A silicide layer is disposed over the source region and drain region. A first interconnect layer is formed over the silicide layer and includes a first runner connected to the source region and second runner connected to the drain region. A second interconnect layer is formed over the first interconnect layer and includes a third runner connected to the first runner and a fourth runner connected to the second runner. An under bump metallization (UBM) is formed over and electrically connected to the second interconnect layer. A mask is disposed over the substrate with an opening in the mask aligned over the UBM. A conductive bump material is deposited within the opening in the mask. The mask is removed and the conductive bump material is reflowed to form a bump.

6 Claims, 23 Drawing Sheets

(51) Int. Cl.
*H01L 21/285* (2006.01)
*H01L 29/45* (2006.01)
*H01L 29/66* (2006.01)
*H01L 21/768* (2006.01)
*H01L 29/78* (2006.01)
*H01L 23/00* (2006.01)

(52) U.S. Cl.
CPC ............... *H01L 2224/05644* (2013.01); *H01L 2224/05647* (2013.01); *H01L 2224/05655* (2013.01); *H01L 2224/11312* (2013.01); *H01L 2224/1132* (2013.01); *H01L 2224/1147* (2013.01); *H01L 2224/11849* (2013.01); *H01L 2224/13109* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/94* (2013.01); *H01L 2224/13006* (2013.01); *H01L 2224/05572* (2013.01); *H01L 2224/16227* (2013.01); *H01L 2924/01322* (2013.01); *H01L 2224/16225* (2013.01); *H01L 2924/12041* (2013.01); *H01L 2924/1306* (2013.01)

(56) References Cited

U.S. PATENT DOCUMENTS

| | | | |
|---|---|---|---|
| 6,569,752 | B1 | 5/2003 | Homma et al. |
| 6,969,909 | B2 | 11/2005 | Briere |
| 6,972,464 | B2 | 12/2005 | Shen |
| 2001/0008224 | A1* | 7/2001 | Woolsey et al. ............... 216/13 |
| 2002/0071293 | A1 | 6/2002 | Eden et al. |
| 2003/0036256 | A1 | 2/2003 | Efland et al. |
| 2003/0157792 | A1* | 8/2003 | Tong et al. .................... 438/614 |
| 2004/0113273 | A1* | 6/2004 | Chen et al. .................... 257/737 |
| 2005/0017299 | A1* | 1/2005 | Shen ............................. 257/341 |
| 2007/0087548 | A1* | 4/2007 | Hsieh et al. ................... 438/613 |
| 2007/0252220 | A1* | 11/2007 | Chen et al. .................... 257/384 |

FOREIGN PATENT DOCUMENTS

| | | |
|---|---|---|
| JP | 2002164437 A | 6/2002 |
| JP | 2005175415 A | 6/2005 |
| JP | 2006080343 A | 3/2006 |
| TW | I239578 B | 9/2005 |

* cited by examiner

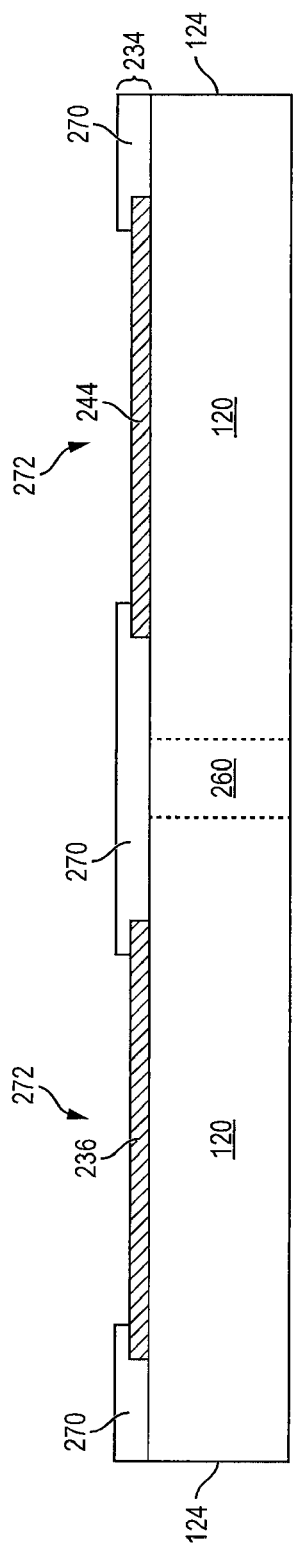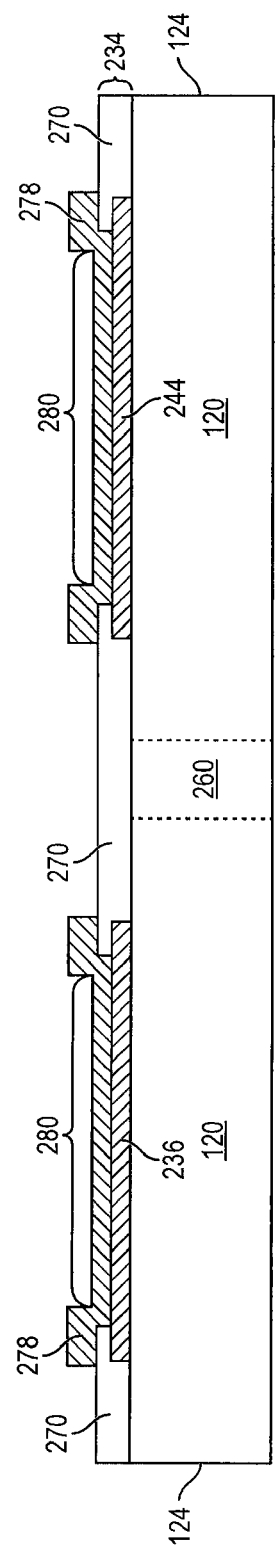

SEMICONDUCTOR DEVICE AND METHOD OF FORMING A POWER MOSFET WITH INTERCONNECT STRUCTURE SILICIDE LAYER AND LOW PROFILE BUMP

FIELD OF THE INVENTION

The present invention relates generally to electronic circuits and semiconductor devices and, more specifically, to a semiconductor device and method of forming a power MOSFET with an interconnect structure and silicide layer formed over closely spaced transistors and further including a low profile bump.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, operate with a lower voltage, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Power MOSFETs are one example of semiconductor devices commonly used in electronic circuits, such as communication systems and power supplies. Power MOSFETs are particularly useful when used as electric switches to enable and disable the conduction of relatively large currents. The on/off state of the power MOSFET is controlled by applying and removing a triggering signal at the gate electrode. When turned on, the electric current in the MOSFET flows between the drain and source. When turned off, the electric current is blocked by the MOSFET.

The miniaturization of power MOSFETs produces devices that include small MOSFET cells or transistors that are distributed across an entire surface of a semiconductor die. MOSFET cells include source and drain regions that are formed at the scale of electrical interconnects, such as bumps formed over source and drain pads, or terminals, for subsequent electrical interconnect. Accordingly, multiple source and drain regions are often located under a single source or drain pad. The use of strictly vertical interconnects within a power MOSFET with closely spaced transistors does not provide for connecting both source and drain regions of a transistor located under a single source pad or drain pad to connect with corresponding horizontally offset source pads and drain pads. Accordingly, an interconnect structure that accounts for horizontal offset is needed to connect source and drain regions located under a single source or drain pad to horizontally offset source and drain pads.

Furthermore, power MOSFETs, like other semiconductor devices, include interconnect structures for electrically connecting the semiconductor device to substrates, circuit boards, and other semiconductor devices. One common technique of interconnecting a semiconductor die with a printed circuit board (PCB) or other device involves the use of solder bumps. FIG. 1a shows a conventional UBM solder bump structure 10. Solder bump structure 10 includes a semiconductor die 11 including a semiconductor wafer of base silicon 12 over which an active area 14 is formed. Active area 14 includes analog or digital circuits implemented as active devices, passive devices, conductive layers, and dielectric layers formed within semiconductor die 11 and electrically interconnected according to the electrical design and function of the semiconductor die. An electrically conductive layer 16 is formed over active area 14 of semiconductor die 11, and operates as a contact pad. An insulation or passivation layer 18 is formed over semiconductor die 11 and conductive layer 16. A portion of insulation layer 18 is removed by an etching process to form opening 20 in the insulation layer that exposes a portion of conductive layer 16. In one embodiment, opening 20 has a width of 270 micrometers (μm). An electrically conductive or UBM layer 22 is formed over, and conformally applied to, conductive layer 16, within opening 20, and over a portion of insulation layer 18. In one embodiment, conductive layer 22 includes an adhesion layer, barrier layer, and wetting layer comprising aluminum (Al), nickel vanadium (NiV), and copper (Cu), respectively. An insulation or passivation layer 24 such as benzocyclobutene (BCB) is formed over conductive layer 22 and insulation layer 18. An opening 26 in insulation layer 24 is formed over and exposes a portion of UBM 22. In one embodiment, opening 26 has a width of 280 μm. A conductive bump 28 is disposed over conductive layers 16 and 22, and within openings 20 and 26 to complete conventional UBM solder bump structure 10. In one embodiment, conductive bump 28 includes a preformed solder sphere with a predetermined diameter 30 of 350 μm that is mounted to conductive layer 22 in a ball drop process.

FIG. 1b shows semiconductor die 11 with the conventional UBM solder bump structure 10 from FIG. 1a packaged as part of an over molded system in package (SiP) 32. Semiconductor die 11 is mounted to substrate or multilayered PCB 34 which further includes conductive contacts 36. Underfill 38 is deposited around bumps 28 and between substrate 34 and active area 14 of semiconductor die 11 to improve a connection between semiconductor die 11 and substrate 34. Bumps 28 undergo multiple reflows to improve electrical and mechanical connections. The multiple reflows of bumps 28 include reflowing bumps 28 for connecting the bumps to semiconductor die 11, reflowing bumps 28 while connected to semiconductor die 11 to connect semiconductor die 11 and bumps 28 to substrate 34, reflowing bumps 28 when mounting SiP 32 to an additional substrate or multilayered PCB, and reflowing bumps 28 for the mounting of additional components to, or rework of, the additional substrate or multi-layered PCB. However, reflowing bumps 28 in some instances leads to solder bridging and electrical shorting among bumps 28, thereby causing failure of semiconductor die 11. Solder bridging and electrical shorting among bumps 28 is more likely to occur when the bumps have a fine pitch. Underfill material 38 is optimized to prevent voiding of the underfill between bumps 28 and to help prevent solder bridging and electrical shorting by keeping bump material localized during reflow. However, controlling placement of underfill material 38 is difficult and may result in the placement of the underfill with a non-uniform thickness. A non-uniform thickness of underfill material 38 is common and includes, for example, a configuration in which only a portion of a gap between semiconductor die 11 and substrate 34 on a first side of the semiconductor die is filled while an entirety of the gap on a second side of the semiconductor die is filled. Unevenly distributed underfill 38 causes an imbalance of stresses on semiconductor die 11 which can lead to cracking and failure of the semiconductor die. Furthermore, encapsulant or mold compound 40 is placed over and around semiconductor die 11. The combination of encapsulant 40 and unevenly distributed underfill 38 further causes an imbalance of stresses on semiconductor die 11, which further leads to cracking and failure of the die. Accordingly, the conventional assembly of SiP 32 with underfill 38 is prone to defects that decrease the yield and reliability of the SiP assemblies.

SUMMARY OF THE INVENTION

A need exists to provide a power MOSFET with a low profile bump and an interconnect structure formed over closely spaced transistors. Accordingly, in one embodiment, the present invention is a method of making a semiconductor device, comprising providing a substrate, forming a source region on a first surface of the substrate, forming a drain region on the first surface of the substrate adjacent to the source region, depositing a silicide layer over the source region and drain region, forming a first interconnect layer over the silicide layer, forming a second interconnect layer over the first interconnect layer, and forming a UBM over and electrically connected to the second interconnect layer. The first interconnect layer includes a first runner connected to the source region and a second runner connected to the drain region. The second interconnect layer includes a third runner connected to the first runner and a fourth runner connected to the second runner. The method further includes the steps of disposing a mask over the substrate with an opening in the mask aligned over the UBM, depositing a conductive bump material within the opening, removing the mask, and reflowing the conductive bump material to form a bump.

In another embodiment, the present invention is a method of making a semiconductor device, comprising providing a substrate including a source region and an adjacent drain region, depositing a silicide layer over the source and drain regions, and forming a first interconnect layer over the silicide layer. The first interconnect layer includes a first runner connected to the source region and a second runner connected to the drain region. The method further includes the steps of forming a UBM over and electrically connected to the first interconnect layer, disposing a mask over the substrate with an opening in the mask aligned over the UBM, depositing a conductive bump material within the opening, removing the mask, and reflowing the conductive bump material to form a bump.

In another embodiment, the present invention is a method of making a semiconductor device, comprising providing a substrate, forming a transistor with a silicide layer on the substrate, forming a first interconnect layer over and connected to the transistor, forming a UBM over and connected to the first interconnect layer, disposing a mask over the substrate with an opening in the mask aligned over the UBM, and depositing a conductive bump material within the opening to form a bump.

In another embodiment, the present invention is a semiconductor device, comprising a substrate including a source region and an adjacent drain region. A silicide layer is disposed over the source and drain regions. A first interconnect layer is formed over the silicide layer. The first interconnect layer includes a first runner connected to the source region and second runner connected to the drain region. A UBM is formed over and electrically connected to the first interconnect layer. A bump is electrically connected to the UBM. The bump has a volume of conductive bump material determined by a volume of a mask opening.

BRIEF DESCRIPTION OF THE DRAWINGS

FIGS. 6a-6i illustrate a method of forming a short UBM structure;

DETAILED DESCRIPTION OF THE DRAWINGS

Figure 1A:
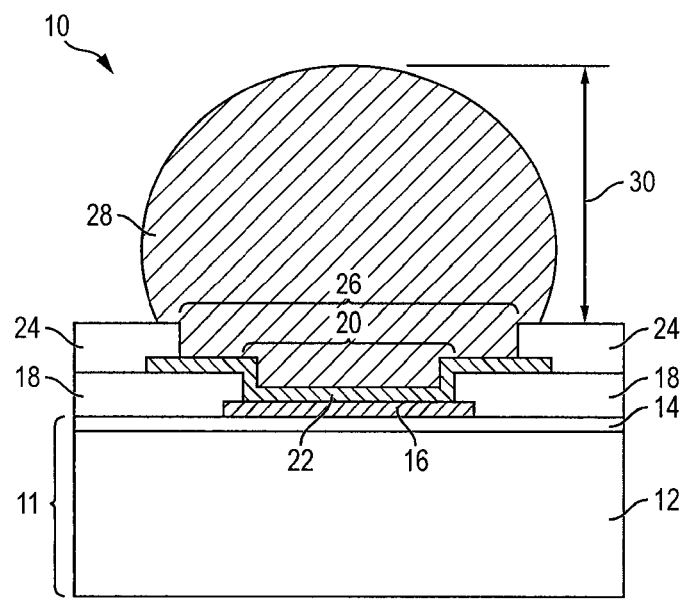
FIGS. 1a-1b illustrate a conventional UBM solder bump structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
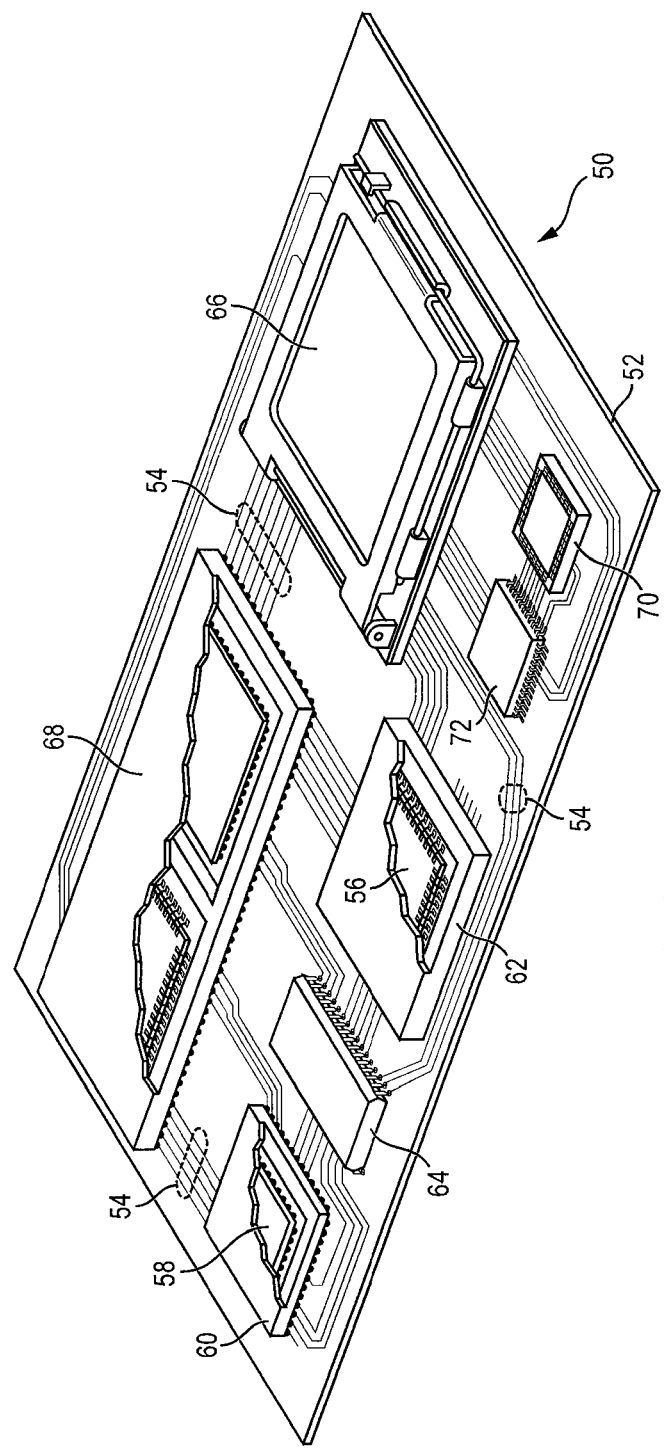
FIG. 2 illustrates a PCB with different types of packages mounted to its surface.

FIG. 2 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
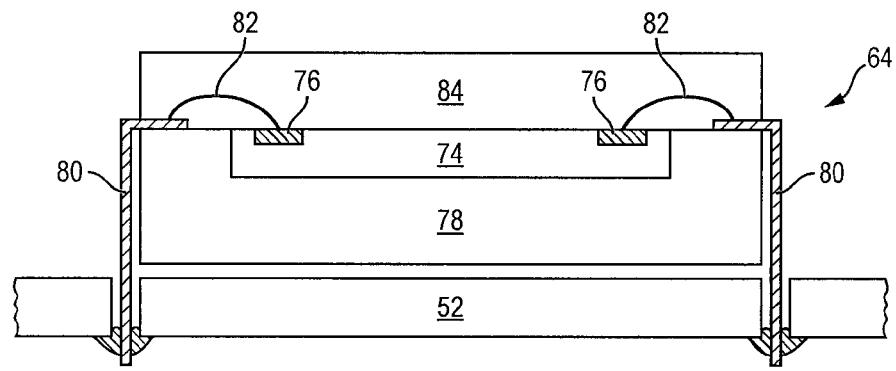
FIGS. 3a-3c illustrate further detail of the representative semiconductor packages mounted to the PCB.
Figure 3B:
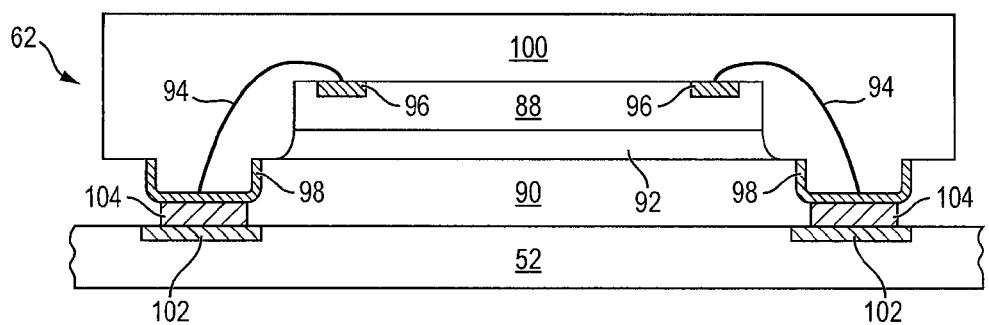
Figure 3C:
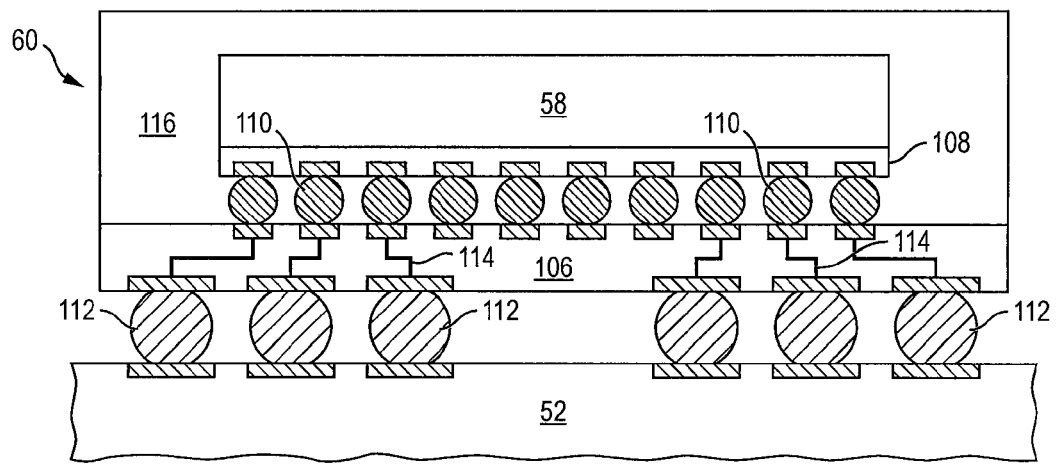

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as Al, Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
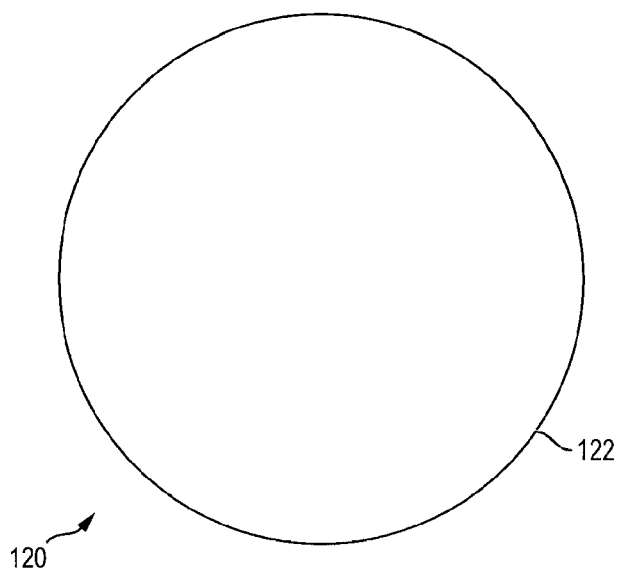
FIGS. 4a-4t illustrate a method of forming a power MOSFET with a silicide layer and interconnect structure.
Figure 4B:
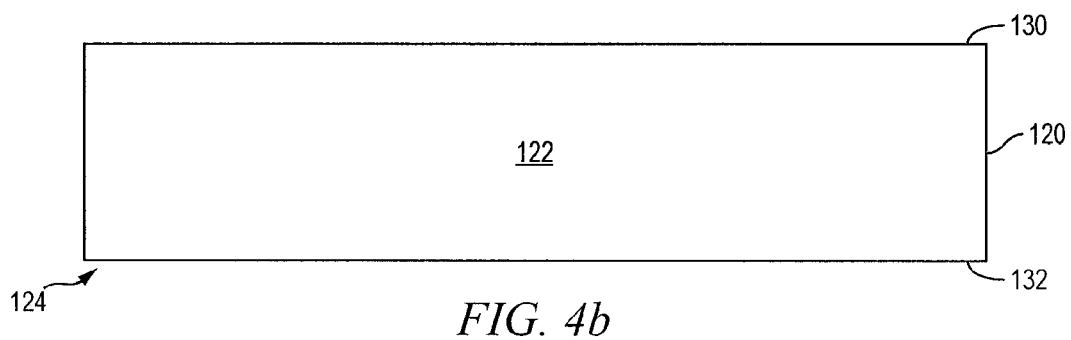
Figure 4C:
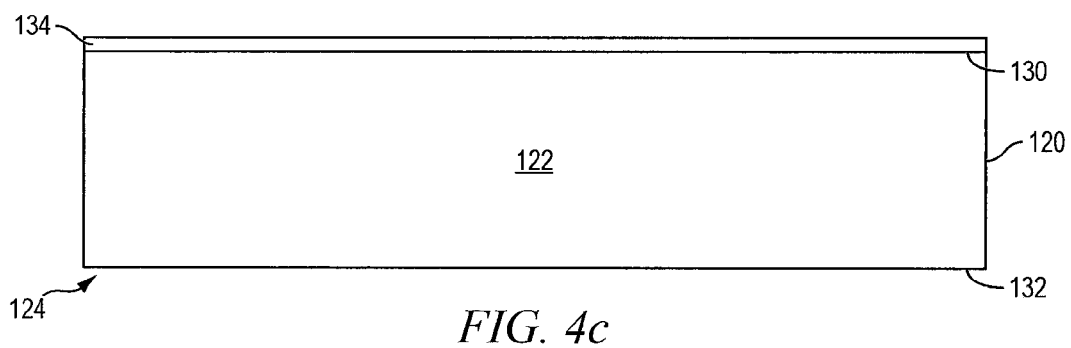
Figure 4D:
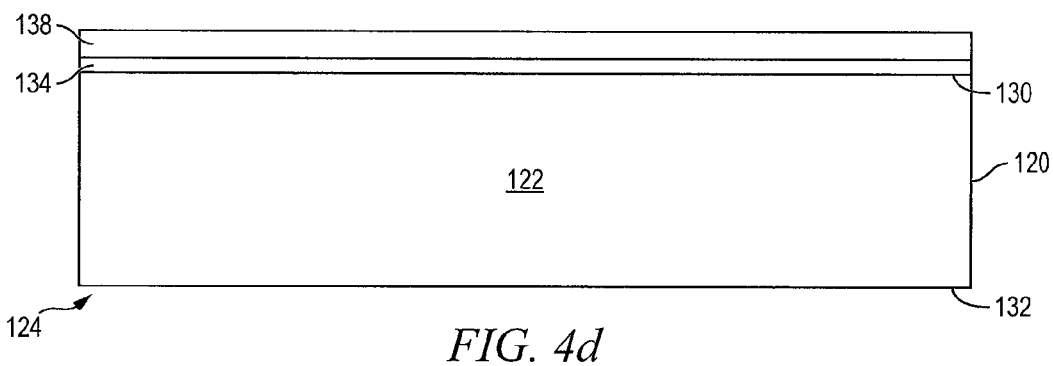
Figure 4E:
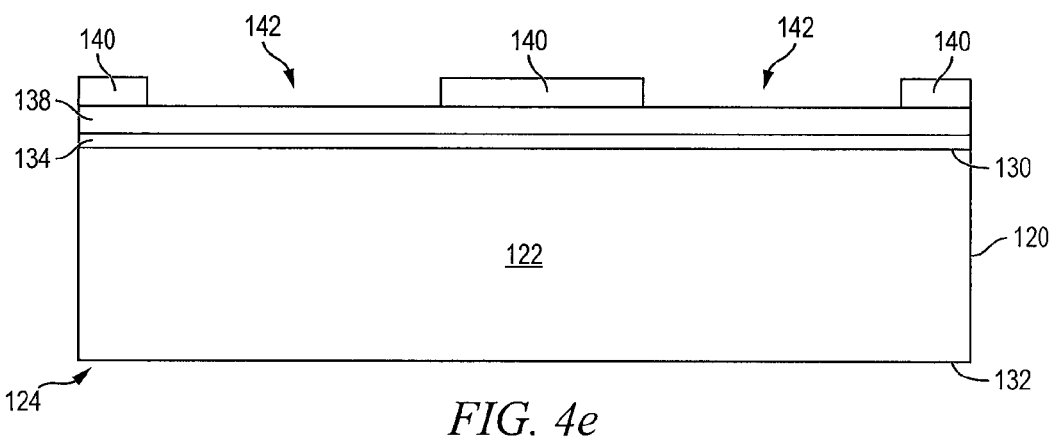
Figure 4F:
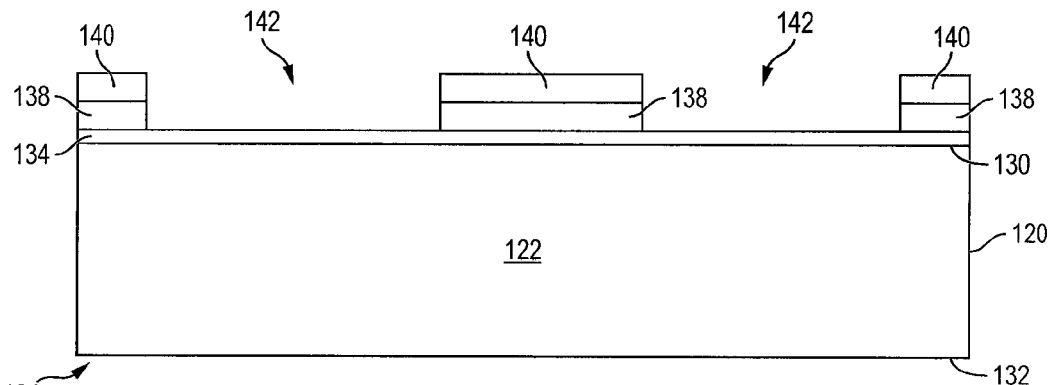
Figure 4G:
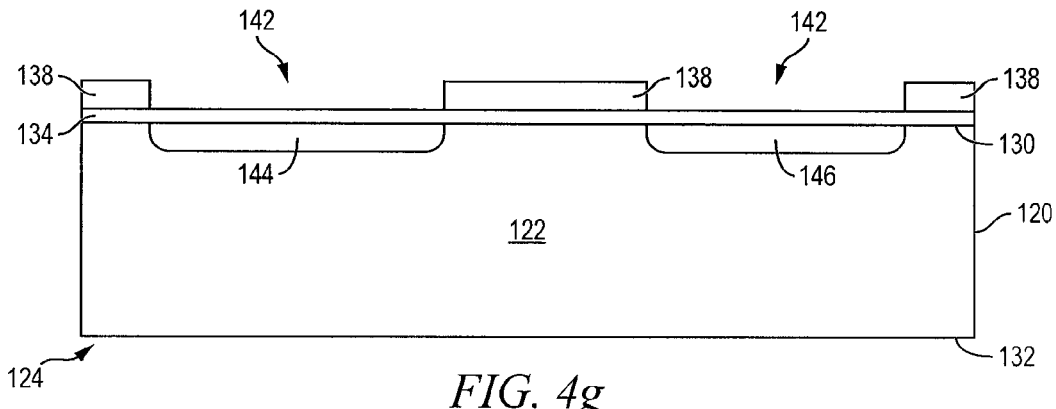
Figure 4H:
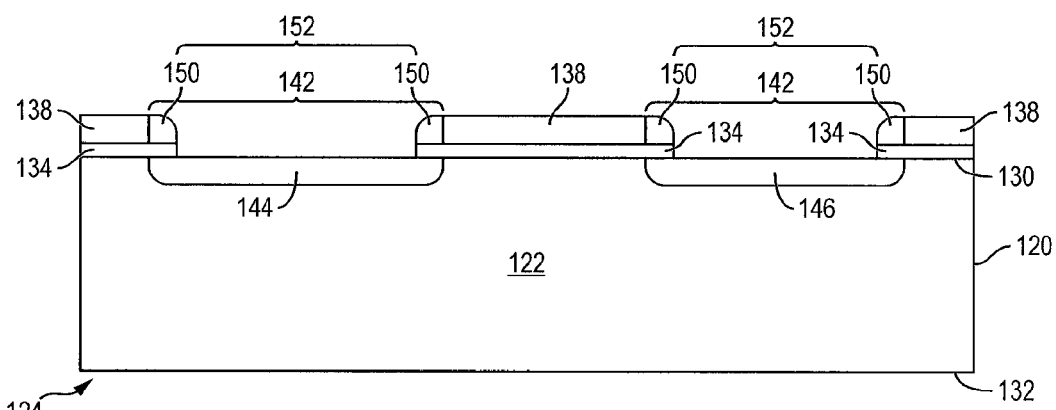
Figure 4I:
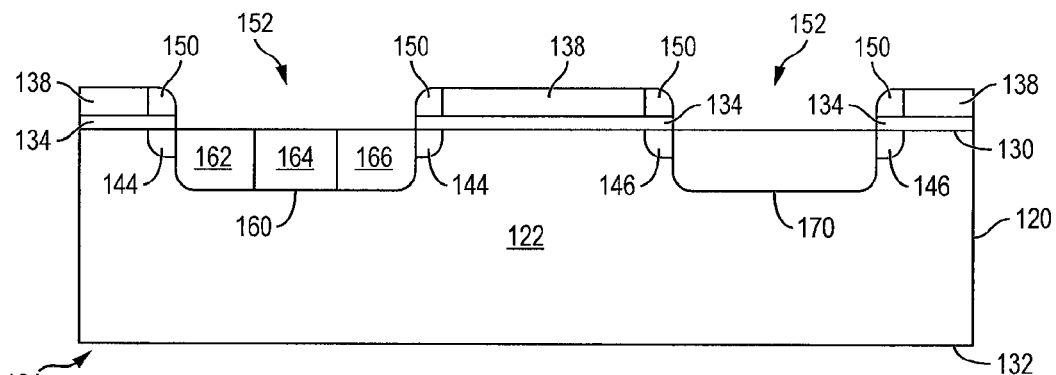
Figure 4J:
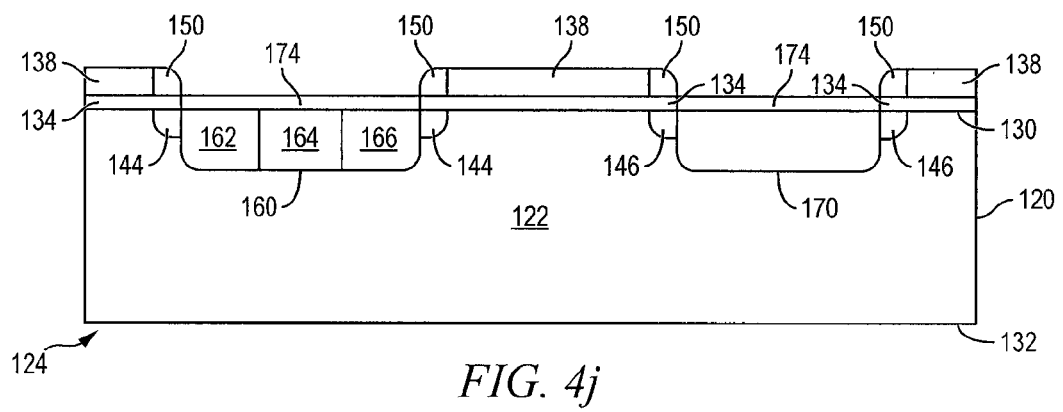
Figure 4K:
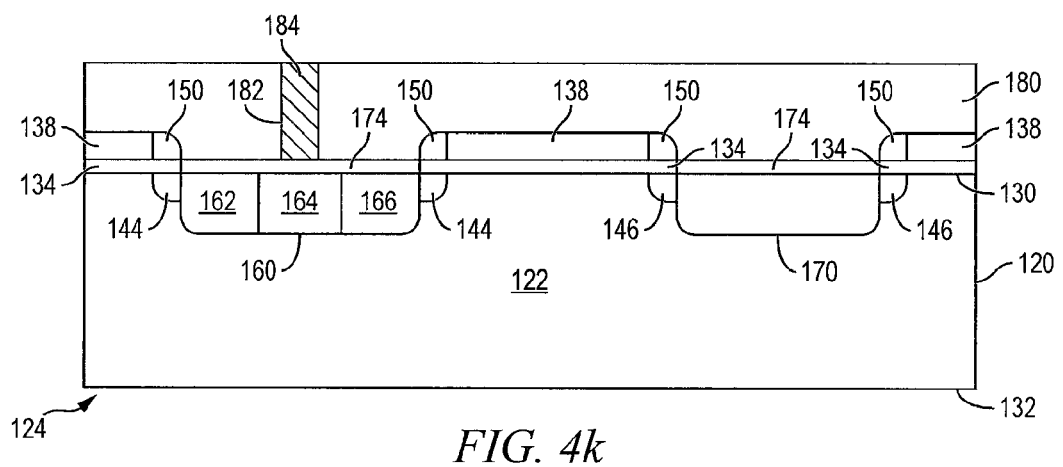
Figure 4L:
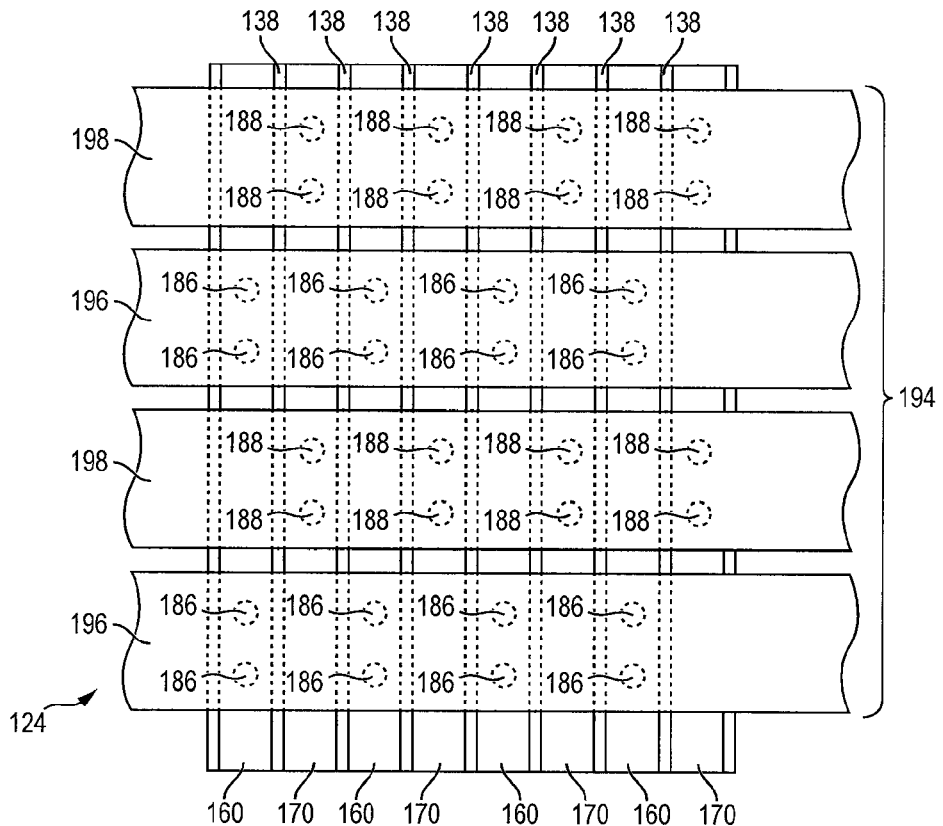
Figure 4M:
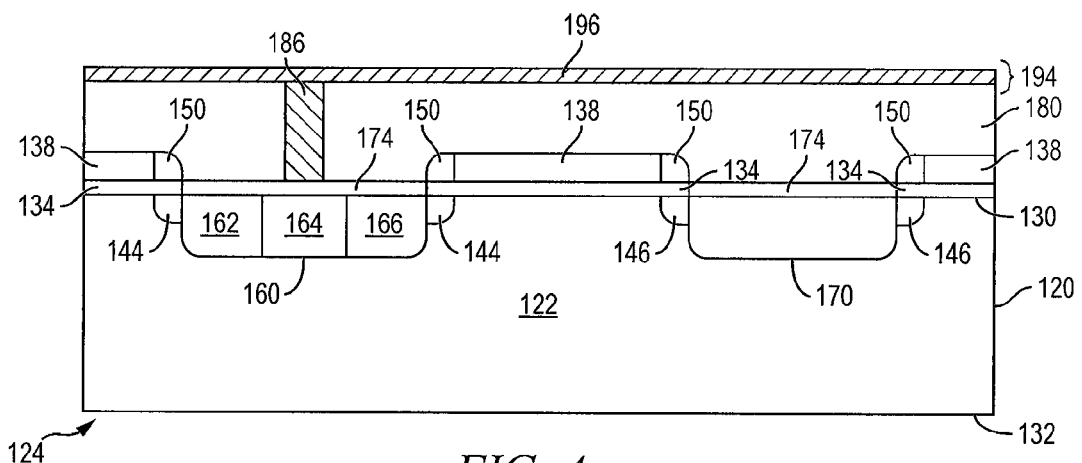
Figure 4N:
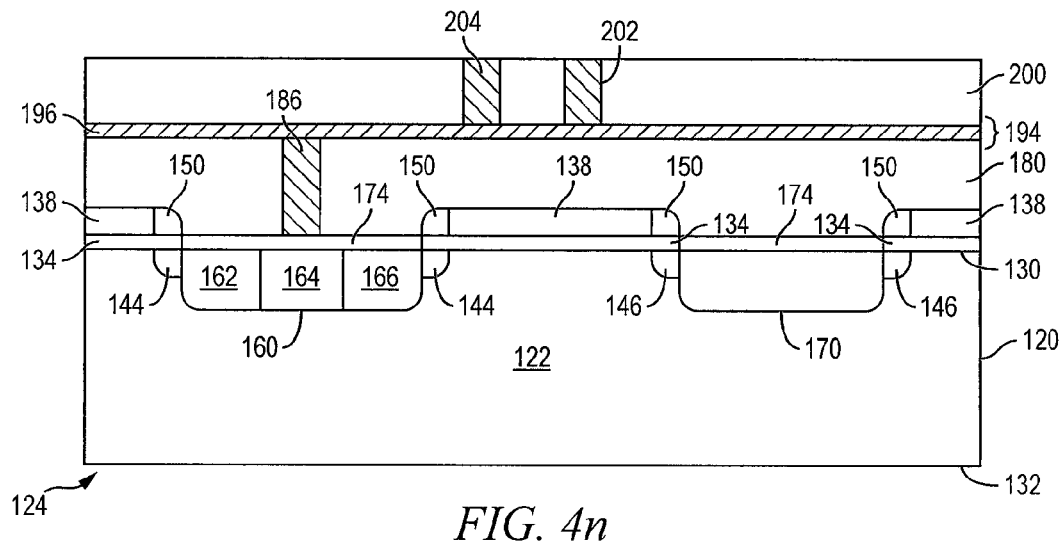
Figure 4O:
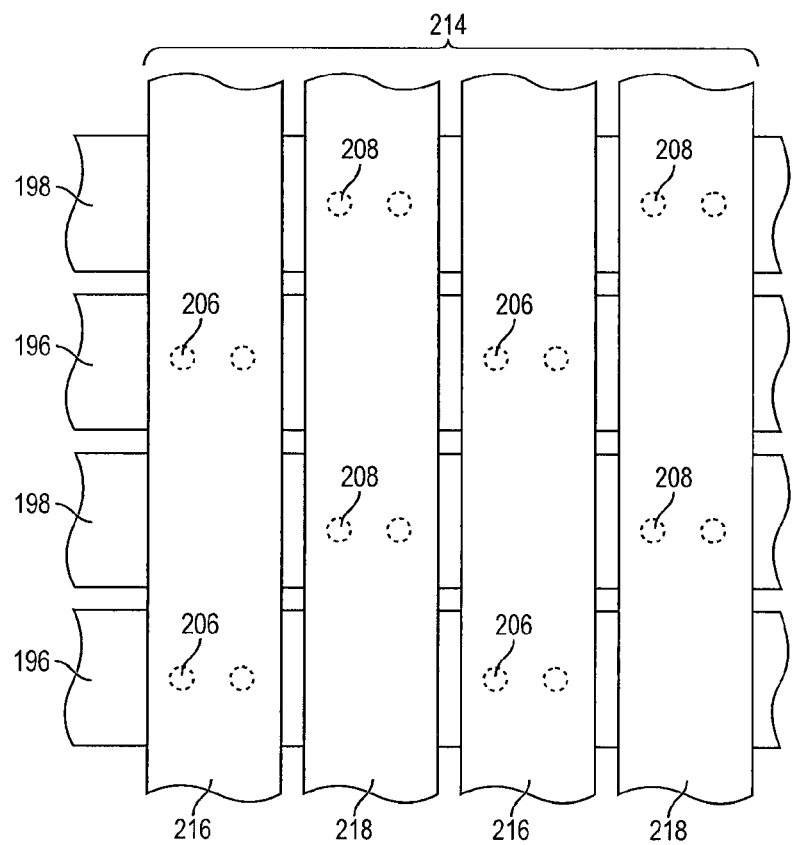
Figure 4P:
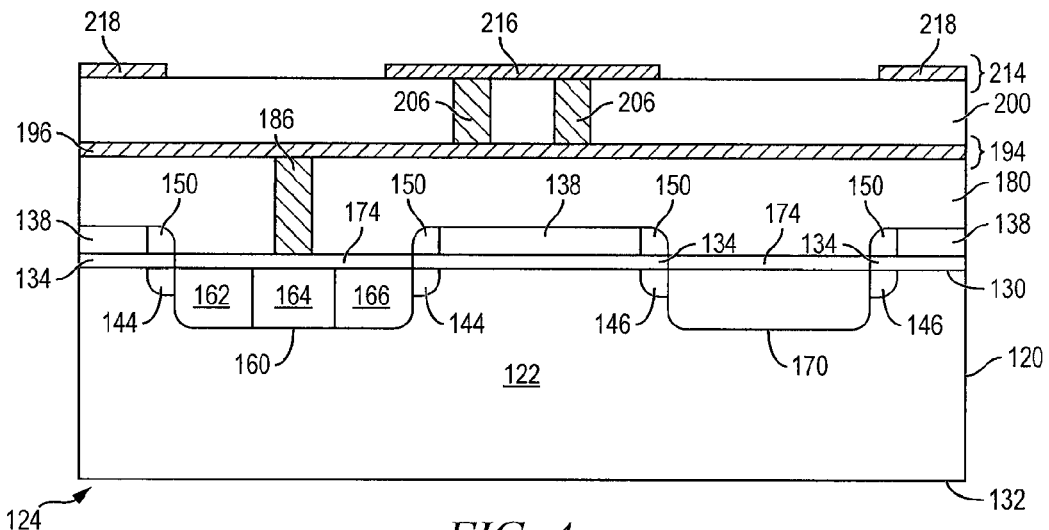
Figure 4Q:
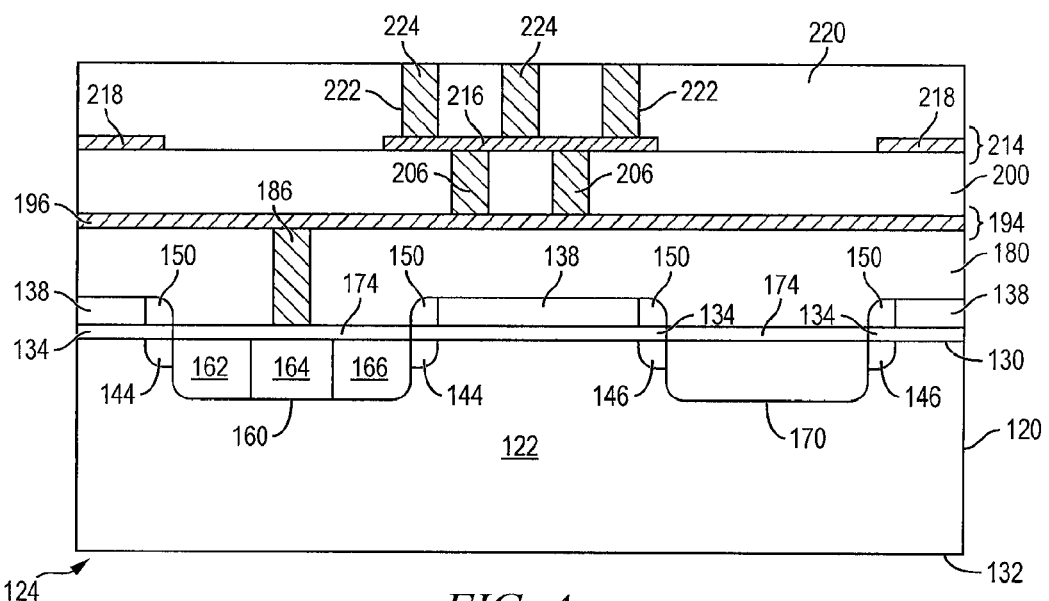
Figure 4R:
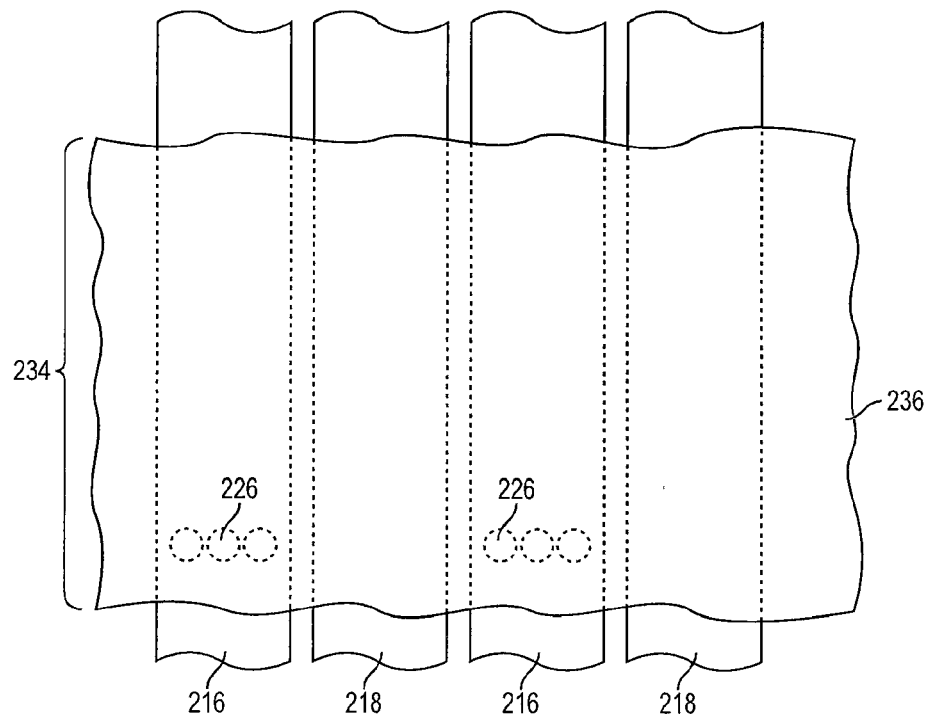
Figure 4S:
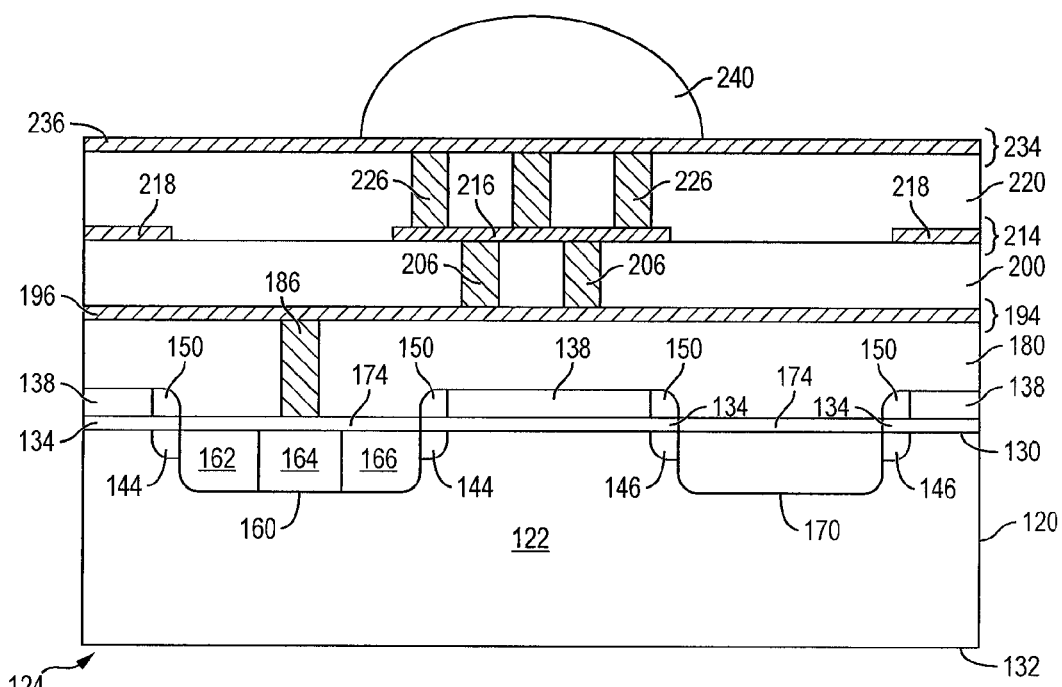
Figure 4T:
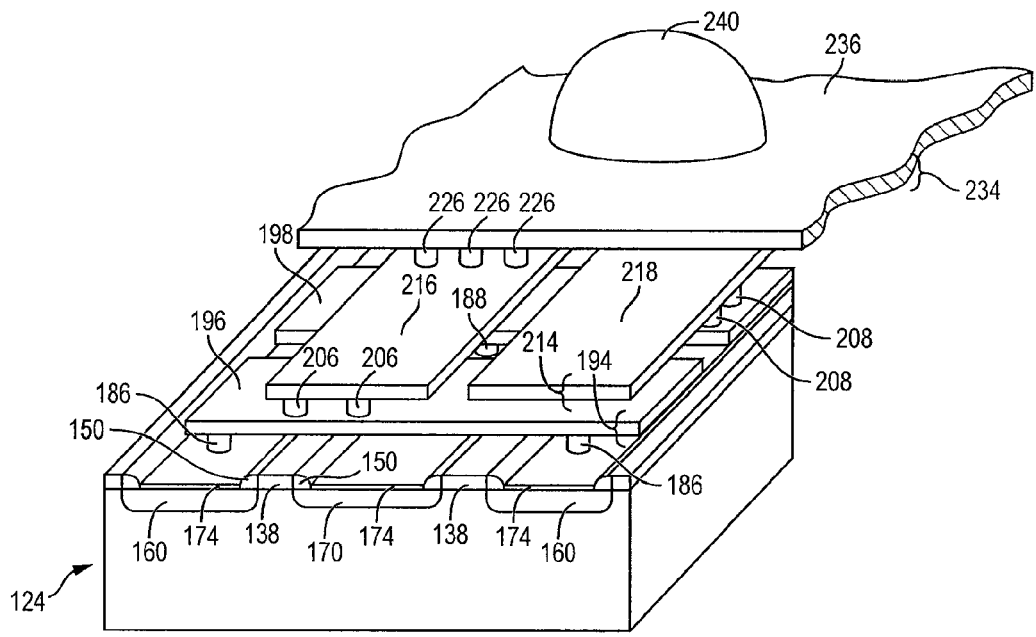

FIGS. 4a-4t illustrate, in relation to FIGS. 2 and 3a-3c, steps in a process of forming a power MOSFET with an interconnect structure and a silicide layer formed over closely spaced transistors, and further including a low profile bump. FIG. 4a shows a semiconductor wafer 120 with a base substrate material 122, such as silicon, germanium, gallium arsenide, indium phosphide, or silicon carbide, for structural support.

FIG. 4b shows a cross-sectional view of a portion of a substrate or semiconductor wafer 120 made of base substrate material 122 for the formation of a MOSFET cell 124. Semiconductor wafer 120 includes a top surface 130 and bottom surface 132 that is opposite top surface 130.

The MOSFET cell 124 can be an n-channel device (N-MOS) or a p-channel device (P-MOS), where "p" denotes a positive carrier type (hole) and "n" denotes a negative carrier type (electron). Although the present embodiment of MOSFET cell 124 is described in terms of a N-MOS device formed on a p-type substrate 120, the opposite type semiconductor material can be used to form a P-MOS device. For example, an n-type substrate can be initially doped with n-type semiconductor material, such as phosphorus, antimony, or arsenic impurities, to form an n-well region. The present embodiment including p-type substrate 120 may further be deposited on top of a p-minus-type substrate.

In FIG. 4c, insulation or dielectric layer 134 is formed over surface 130 of substrate 120 as a gate oxide layer. Insulation layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polyimide, BCB, polybenzoxazoles (PBO), or other suitable dielectric material. Insulation layer 134 is formed using PVD, CVD, screen printing, spin coating, spray coating, sintering, or thermal oxidation.

In FIG. 4d, a polysilicon layer 138 is formed over insulating layer 134. In FIG. 4e, photoresist layer 140 is formed over polysilicon layer 138. A portion of photoresist layer 140 is removed by an etching process to form openings 142 in the photoresist layer and to expose a portion of polysilicon layer 138. The remaining portion of photoresist layer 140 not removed in the etching process corresponds to a gate pattern, within MOSFET cell 124.

In FIG. 4f, the portion of polysilicon layer 138 located within a footprint of openings 142 and outside photoresist layer 140 is removed by an etching process. A remaining portion of polysilicon layer 138 serves as a gate for later formed transistors within MOSFET cell 124.

In FIG. 4g, a remainder of photoresist layer 140 is removed after the etching of polysilicon layer 138. FIG. 4g further shows substrate 120 is doped with n-type semiconductor material, such as arsenic, to form lightly doped drain (LDD) regions 144 and 146. The n-type dopant is deposited by ion implantation. The dosages of dopant introduced by the ion implantation can vary such that LDD regions 144 and 146 include n-minus LDDs and n-type regions.

In FIG. 4h, insulation layer 150 is formed around polysilicon layer 138 over insulation layer 134. Insulation layer 150 also extends over a portion of LDD regions 144 and 146. Insulation layer 150 contains one or more layers of SiO2, Si3N4, SiON, Ta2O5, Al2O3, polyimide, BCB, PBO, or other suitable dielectric material. Insulation layer 150 is formed using PVD, CVD, screen printing, spin coating, spray coating, sintering, or thermal oxidation. A portion of insulation layer 134 over LDD regions 144 and 146 is removed by an etching process using polysilicon layer 138 and insulation layer 150 as the mask. The remaining portion of insulation layer 134 extends beyond polysilicon layer 138 over LDD regions 144 and 146 and below insulation layer 150. Insulation layer 150 also operates as a sidewall spacer to mask subsequent drain and source ion implantation. The placement of insulation layer 150 reduces an area of insulation layer 134 exposed by openings 142, thereby forming openings 152 with an area less than the area of openings 142.

In FIG. 4i, the portion of LDD regions 144 and 146 outside the mask formed by polysilicon layer 138 and insulation layer 150 (i.e., within openings 152) is heavily doped to form source region 160 and drain region 170. While FIG. 4i shows a single source region 160 and single drain region 170, MOSFET cell 124 includes a plurality of source and drain regions 160 and 170 as shown in subsequent FIGs. Source regions 160 and drain regions 170 extend into wafer 120 farther than previously formed LDDs 144 and 146, respectively. Accordingly, an area of LDD regions 144 and 146 is reduced by the formation of source regions 160 and drain regions 170, such that LDD regions 144 and 146 occupy a reduced area located below insulation layer 150 and do not occupy the area within openings 152. In one embodiment, the varying dosages of implantation used to form LDD regions 144 and 146 result in n-minus-type LDDs 144 and n-type regions 146.

FIG. 4i further shows source region 160 is comprised of regions 162, 164, and 166. Regions 162, 164, and 166 can be doped according to various configurations. In a first configuration, region 162 is doped as an n-plus-type region, region 164 is doped as a p-plus-type region, and region 166 is doped as an n-type region. In a second configuration, region 164 is doped as a p-plus-type region and regions 162 and 166 are doped as n-plus-type regions adjacent to either side of p-plus-type region 164. Additionally, regions 162 and 164 of source region 160 can include LDDs 144. On the other hand, LDDs 144 may be entirely absent from source region 160. Drain region 170, also formed in FIG. 4i, is doped as an n-plus-type region. Drain region 170 is disposed between n-type regions 146.

In FIG. 4j, a silicide layer 174 is formed as a thin layer over source region 160, over drain region 170, and within openings 152 in passivation layer 134. Silicide layer 174 includes WSi2, TiSi2, MoSi2, TaSi2, or other suitable silicides and is formed by using PVD, CVD, co-evaporation, sputtering, or other suitable process. When silicide layer 174 is formed by PVD, silicide layer 174 is self-aligned by depositing a refractory metal over semiconductor wafer 120 and heating the semiconductor wafer and refractory metal such that the silicide layer is formed where the refractory metal contacts the semiconductor wafer. Excess refractory metal that has not reacted to form a portion of the silicide layer is removed. Silicide layer 174 is formed on a top surface of source region 160 and on a top surface of drain region 170. In one embodiment, silicide layer 174 has a thickness in the range of 100-3,000 angstroms. Silicide layer 174 serves as a metal conductor across the top surface of source and drain regions 160 and 170. The presence of silicide layer 174 reduces overall cost of MOSFET cell 124 and serves as a metallization path that enhances current conduction by forming part of a low resistance electrical path from a later formed bump to source and drain regions 160 and 170, respectively.

In FIG. 4k, an insulation layer or interlayer dielectric (ILD) 180 is formed over semiconductor wafer 120, including over polysilicon layer 138, insulation layer 150, and silicide layer 174. ILD 180 contains one or more layers of SiO2, Si3N4, SiON, Ta2O5, Al2O3, polyimide, BCB, PBO, or other suitable dielectric material. ILD 180 is formed using PVD, CVD, screen printing, spin coating, spray coating, sintering, or thermal oxidation. A portion of ILD 180 is removed by an etching process to form vias 182. Vias 182 extend from a top surface of ILD 180, through the ILD, and to silicide layer 174 to provide subsequent electrical connection to source region 160, and drain region 170. An electrical connection is also made with the gate electrode for MOSFET cell 124 at polysilicon layer 138, which can include a connection with via 182. Conductive material 184 is formed in vias 182 and over the exposed portions of silicide layer 174 to form conductive vias. Conductive material 184 includes tungsten (W), and may also include Al, Cu, Sn, Ni, Au, Ag, titanium (Ti), polysilicon, or other suitable electrically conductive material, and is formed using PVD, CVD, electrolytic plating, electroless plating process, or other suitable metal deposition process.

FIG. 4l shows a top plan view of MOSFET cell 124 from FIG. 4k. Source region 160 and drain region 170 of MOSFET cell 124 are formed in substrate 120 as interleaved stripes extending across substrate 120. Source region 160 and drain region 170 are alternately spaced at intervals of a fixed distance, and are separated by polysilicon gate 138.

Conductive material 184 is deposited in vias 182 to form conductive vias 186 over source region 160 and conductive vias 188 over drain region 170. Conductive vias 186 and 188 provide electrical connection from source and drain regions 160 and 170, respectively, to a first interconnect layer 194.

The first interconnect layer 194 is formed over ILD 180, over conductive pillars 186 and 188, and over source and drain regions 160 and 170. The first interconnect layer 194 includes source runners or conductive layers 196 and drain runners or conductive layers 198. Source runners 196 and drain runners 198 can be one or more layers, and can be Cu, Sn, Ni, NiV, Au, Ag, Al or other suitable conductive material. Source runners 196 and drain runners 198 are patterned and deposited using electrolytic plating, electroless plating, sputtering, PVD, CVD, or other suitable metal deposition process. Although source runners 196 and drain runners 198 shown in FIG. 4l are rectangular and of substantially equal widths, the runners can be of any shape. For instance, source runners 196 and drain runners 198 may be of unequal widths and runners may have varying narrow and wider portions and rounded corners. In one embodiment, first source and drain runners 196 and 198 include dimensions that are short and wide relative to conventional devices. Source runners 196 and drain runners 198 are interleaved and alternately spaced at intervals of a fixed distance, and are oriented substantially parallel with respect to each other. Source runners 196 and drain runners 198 are oriented substantially perpendicular or orthogonal with respect to source regions 160 and drain regions 170. Alternatively, other non-perpendicular orientations (e.g., angled or parallel) may be used. The repeating interleaved or alternating intervals at which source runners 196 and drain runners 198 are oriented produce a unit structure distributed over the surface of semiconductor wafer 120.

The source and drain runners 196 and 198 are electrically connected to source and drain regions 160 and 170, respectively, through conductive vias 186 and 188, respectively. FIG. 4l shows two vias 186 are used to form the electrical connection between source region 160 and source runner 196 at a location where the source region and source runner overlap. Similarly, FIG. 4l further shows two vias 188 are used to form the electrical connection between drain region 170 and source runner 198 at a location where the drain region and drain runner overlap. Alternatively, one conductive via, or more than two conductive vias can be used to connect source and drain regions 160 and 170 to source and drain runners 196 and 198, respectively.

FIG. 4m, continuing from FIG. 4k, shows a cross sectional view of MOSFET cell 124 and source runner 196. Source runner 196, from FIG. 4l, is formed over and electrically connected to conductive via 186.

In FIG. 4n, an insulation layer or ILD 200 is formed over first interconnect layer 194 and ILD 180. ILD 200 contains one or more layers of SiO2, Si3N4, SiON, Ta2O5, Al2O3, polyimide, BCB, PBO, or other suitable dielectric material. ILD 200 is formed using PVD, CVD, screen printing, spin coating, spray coating, sintering, or thermal oxidation. A portion of ILD 200 is removed by an etching process to form vias 202. Vias 202 extend from a top surface of ILD 200, through the ILD, to first interconnect layer 194. Conductive material 204 is formed in vias 202 and over the exposed portions of first interconnect layer 194 to form conductive vias. Conductive material 204 includes W, and may also include Al, Cu, Sn, Ni, Au, Ag, Ti, polysilicon, or other suitable electrically conductive material, and is formed using PVD, CVD, electrolytic plating, electroless plating process, or other suitable metal deposition process.

FIG. 4o shows a top plan view of the partially formed semiconductor device from FIG. 4n. Conductive material 204 formed in vias 202 results in conductive vias 206 formed over source runners 196 and conductive vias 208 formed over drain runners 198. Conductive vias 206 and 208 provide electrical connection from source and drain runners 196 and 198, respectively, to a second interconnect layer 214.

The second interconnect layer 214 is formed over ILD 200, over conductive pillars 206 and 208, and over first interconnect layer 194. The second interconnect layer 214 includes source runners or conductive layers 216 and drain runners or conductive layers 218. Source runners 216 and drain runners 218 can be one or more layers, and can be Cu, Sn, Ni, NiV, Au, Ag, Al or other suitable conductive material. Source runners 216 and drain runners 218 are patterned and deposited using electrolytic plating, electroless plating, sputtering, PVD, CVD, or other suitable metal deposition process. Although source runners 216 and drain runners 218 shown in FIG. 4o are of substantially equal widths and rectangular, the runners can be of any shape. For instance, source runners 216 and drain runners 218 may be of unequal widths and runners may have varying narrow and wider portions and rounded corners. In one embodiment, second source and drain runners 216, and 218 include dimensions that are short and wide relative to conventional devices. Source runners 216 and drain runners 218 are interleaved and alternately spaced at intervals of a fixed distance, and are oriented substantially parallel with respect to each other. Source runners 216 and drain runners 218 are oriented substantially perpendicular or orthogonal with respect to source runners 196 and drain runners 198. Alternatively, other non-perpendicular orientations (e.g., angled or parallel) may be used. The repeating interleaved or alternating intervals at which source runners 216 and drain runners 218 are oriented produce a unit structure distributed over source runners 196 and drain runners 198, as well as over the surface of semiconductor wafer 120.

Source and drain runners 216 and 218 are electrically connected to source and drain runners 196 and 198, respectively, through conductive vias 206 and 208, respectively. FIG. 4o shows two vias 206 are used to form the electrical connection between source runner 196 and source runner 216 at a location where source runners 196 and 216 overlap. Similarly, FIG. 4o further shows two vias 208 are used to form the electrical connection between drain runners 198 and 218 at a location where the drain runners overlap. Alternatively, one conductive via, or more than two conductive vias can be used to connect source and drain regions 160 and 170 to source and drain runners 196 and 198, respectively.

FIG. 4p, continuing from FIG. 4n, shows a cross sectional view of MOSFET cell 124 and source runner 216 and drain runners 218. Source runner 216, from FIG. 4o, is formed over and electrically connected to conductive vias 206.

In FIG. 4q, an insulation layer or ILD 220 is formed over second interconnect layer 214 and ILD 200. ILD 220 contains one or more layers of SiO2, Si3N4, SiON, Ta2O5, Al2O3, polyimide, BCB, PBO, or other suitable dielectric material. ILD 220 is formed using PVD, CVD, screen printing, spin coating, spray coating, sintering, or thermal oxidation. A portion of ILD 220 is removed by an etching process to form vias 222. Vias 222 extend from a top surface of ILD 220, through the ILD, to second interconnect layer 214. Conductive material 224 is formed in vias 222 and over the exposed portions of second interconnect layer 214 to form conductive vias. Conductive material 224 includes W, and may also include aluminum Al, Cu, Sn, Ni, Au, Ag, Ti, polysilicon, or other suitable electrically conductive material using PVD, CVD, sputtering, electrolytic plating, electroless plating process, or other suitable metal deposition process.

FIG. 4r shows a top plan view of the partially formed semiconductor device from FIG. 4q. Conductive material 224 formed in vias 222 results in conductive vias 226 formed over source runners 216. Conductive vias 226 provide electrical connection from source runners 216 to a third interconnect level 234. Source pad 236 is formed at the third interconnect level 234 over ILD 220, over conductive pillars 226, and over second interconnect layer 214. Source pad 236 can be one or more layers of Cu, Sn, Ni, NiV, Au, Ag, Al or other suitable conductive material. Source pad 236 is patterned and deposited using electrolytic plating, electroless plating, sputtering, PVD, CVD, or other suitable metal deposition process.

Source pad 236 is configured to be connected to a later formed source bump which provides electrical connection between source region 160 and devices external to MOSFET cell 124. Similarly, conductive material 224 formed in vias 222 and over drain runners 218 provide electrical connection from drain runners 218 to a drain pad. The drain pad is configured to be connected to a later formed drain bump which provides electrical connection from drain region 170 to devices external to MOSFET cell 124.

FIG. 4s, continuing from FIG. 4q, shows a cross sectional view of MOSFET cell 124 and source pad 236. Source pad 236, from FIG. 4r, is formed over and electrically connected to conductive vias 226. An electrically conductive bump material is deposited over source pad 236 to form source bump or interconnect 240, as is described in additional detail in FIGS. 6a-6i. Source bump 240 provides electrical connection from source region 160 to devices external to MOSFET cell 124. Source bumps 240 represent one type of interconnect structure that can be formed over source pad 236. Source bump or interconnect 240 can also use bond wires, conductive paste, stud bump, micro bump, or other electrical interconnect.

FIG. 4t shows an isometric three dimensional view of MOSFET cell 124. The first interconnect layer 194, second interconnect layer 214, and conductive vias provide electrical interconnection from source and drain regions 160 and 170 to source and drain pads at the third interconnect level 234. Thus, the problem of connecting small closely aligned transistors formed across an entire surface of a semiconductor die with both source and drain connections located under a single source pad or drain pad is solved. Rather than using strictly vertical interconnects which would connect transistor source and drain regions to a single source or drain pad, conductive runners are configured to connect transistor source regions and drain regions under a single pad to multiple corresponding pads. Thus, transistor drain regions are connected to drain pads, and transistor source regions are connected to source pads. Specifically, source region 160 is electrically connected to source bump 240 by source pad 236, conductive vias 186, source runner 196, conductive via 206, source runner 216, and conductive vias 226. Similarly, drain region 170 is electrically connected to a drain pad by conductive vias 188, drain runner 198, conductive vias 208, drain runner 218, and additional conductive vias extending from drain runner 218 to the drain pad.

Silicide layer 174 is formed over source region 160 and drain region 170. Silicide layer 174 is formed on the top surfaces of source region 160 and drain region 170. Silicide layer 174 serves as a metal conductor across the top surface of source and drain regions 160 and 170 to reduce overall cost of MOSFET cell 124 and serve as a metallization path to enhance current conduction as part of a low resistance electrical path from source and drain regions 160 and 170, respectively, to later formed bumps.

Figure 5A:
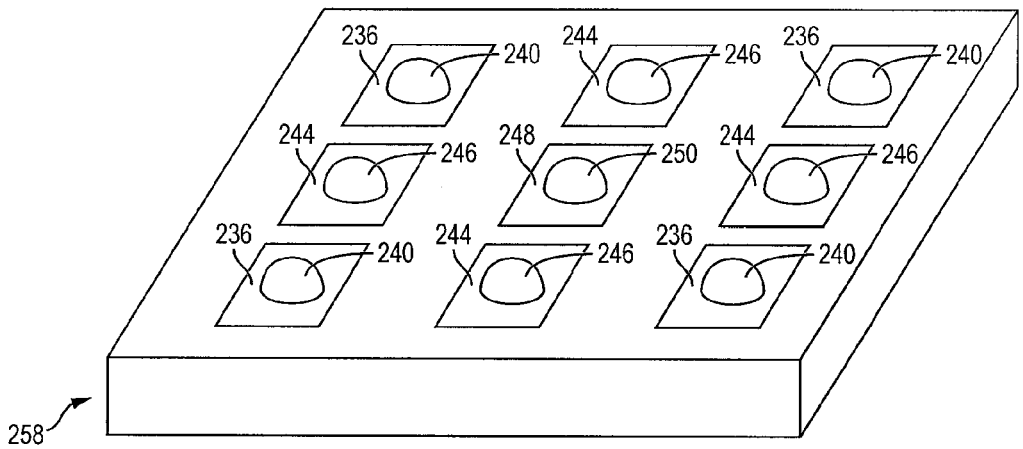
FIGS. 5a-5c illustrate further detail of power MOSFETs.

FIG. 5a shows an isometric three dimensional view of a power MOSFET 258 including a plurality of MOSFET cells, such as MOSFET cells 124 from FIG. 4t. Power MOSFET 258 contains hundreds or thousands of MOSFET cells 124. In FIG. 5a, detail of MOSFET cells such as the detail of MOSFET cell 124 shown in FIG. 4t, including source region 160, drain region 170, and polysilicon gate 138, as well as first interconnect layer 194, second interconnect layer 214, and conductive vias including conductive vias 186, 188, 206, 208, and 226 are not explicitly shown, but are included within power MOSFET 258 below source bumps 240, drain bumps 246, and gate bump 250. FIG. 5a further shows source bumps 240 formed over source pads 236, drain bumps 246 formed over drain pads 244, and a gate bump 250 formed over gate pad 248. In the embodiment shown in FIG. 5a, source pads 236 and drain pads 244 are arranged in a checkerboard configuration across a top surface of power MOSFET 258. Electrical connections for the plurality of MOSFET cells 124 are routed through the plurality of source pads 236, drain pads 244, and gate pads 248. Power MOSFET 258 contains arrays of interconnected MOSFET cells that cover most of the die or package area within each power MOSFET 258. Each power MOSFET 258 operates as a single monolithic switching device capable of handling many amperes of electrical current.

Figure 5B:
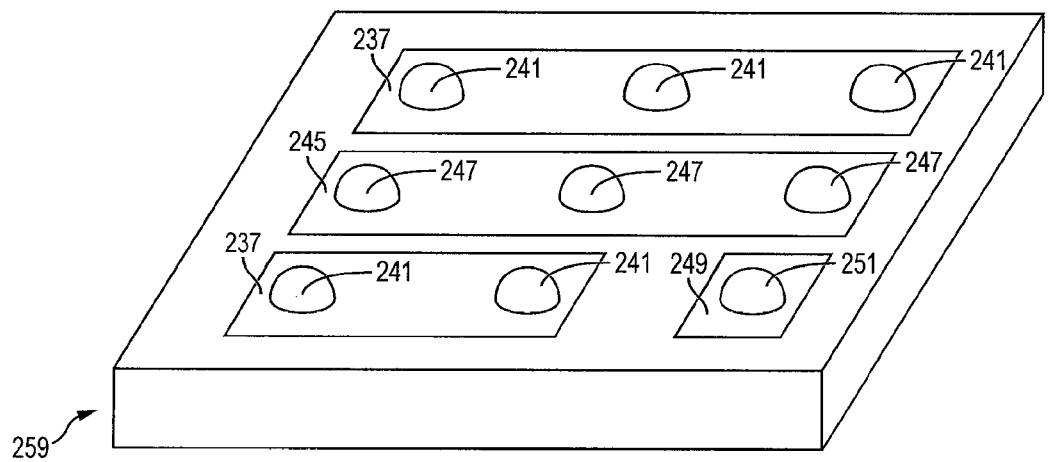

FIG. 5b shows an alternate isometric three dimensional view of power MOSFET 259 similar to power MOSFET 258 shown in FIG. 5a. Source pads 237 and a drain pad 245 shaped as "stripes" are interleaved and alternately spaced at intervals of a fixed distance, and are oriented substantially parallel with respect to each other. Gate pad 249 is formed over a top surface of power MOSFET 259 in-line with a shortened source pad 237 or a shortened drain pad 245 according to the configuration and design of the power MOSFET. FIG. 5b further shows source bumps 241 formed over source pads 237, drain bumps 247 formed over drain pads 245, and a gate bump 251 formed over gate pad 249.

Figure 5C:
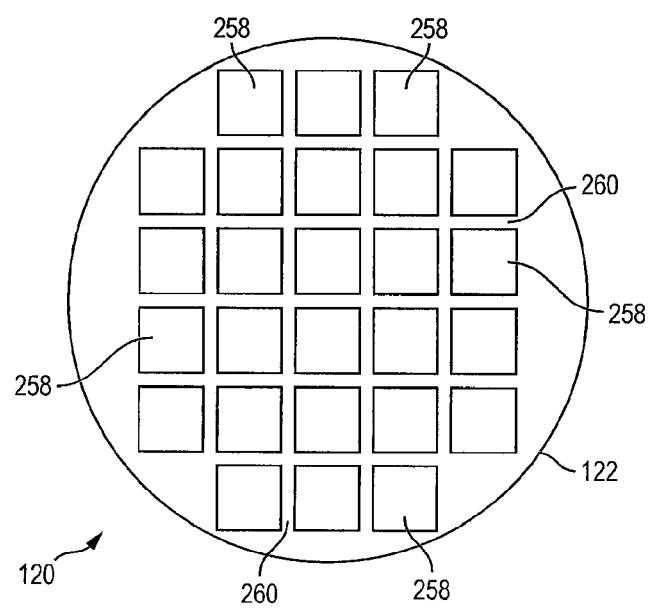

FIG. 5c shows a top plan view of semiconductor wafer 120 from FIG. 4a further including a plurality of power MOSFETs 258. Power MOSFETs 258 are formed on base substrate material 122 and are separated by saw streets 260 as described above.

FIGS. 6a-6i illustrate, in relation to FIGS. 4a-4t, and 5a-5c, further detail regarding a process of forming bumps 240, 246, and 250 on pads 236, 244, and 248, respectively.

FIG. 6a shows a cross-sectional view of a portion of semiconductor wafer 120, including portions of multiple MOSFET cells 124 belonging to separate power MOSFETs 258 separated by saw street 260. Both a source contact pad 236 and a drain contact pad 244 are shown at the third interconnect level 234 over MOSFET cells 124. Detail of MOSFET cells 124 shown in FIG. 4t, including source region 160, drain region 170, and polysilicon gate 138, as well as first interconnect layer 194, second interconnect layer 214, and conductive vias including conductive vias 186, 188, 206, 208, and 226 are not explicitly shown, but are included below source pad 236 and drain pad 244. Before a source bump is formed over source pad 236, and before a drain bump is formed over source pad 244, a number of intervening layers are formed over the source and drain pads. Specifically, an insulation or passivation layer 270 is conformally applied to the semiconductor device at the third interconnect level 234 over a top surface of MOSFET cells 124, source contact pad 236, drain contact pad 244, and saw streets 260. A bottom surface of insulation layer 270 is conformally applied to and follows a contour of a bottom surface of the third interconnect level, source contact pad 236, and drain contact pad 244. A top surface of insulation layer 270 is substantially planar such that the insulation layer has a first thickness over semiconductor wafer 120 outside a footprint of source pad 236 and drain pad 244, and a second thickness over semiconductor wafer 120 within a footprint of source pad 236 and drain pad 244. The first thickness is greater than the second thickness. The insulation layer 270 can be one or more layers of SiO2, Si3N4, SiON, Ta2O5, zircon (ZrO2), Al2O3, polyimide, BCB, PBO, or other material having suitable electrical insulating properties. The insulation layer 270 is patterned or blanket deposited using PVD, CVD, printing, spin coating, sintering with curing, or thermal oxidation. A portion of insulation layer 270 is removed by an etching process to create openings 272 in insulation layer 270 which expose a portion of source pad 236 and drain pad 244. Openings 272 extend from a top surface of insulation layer 270 to a bottom surface of the insulation layer. In one embodiment, opening 272 has a width of 270 μm, analogous to the width of opening 20 from FIG. 1a. Another portion of source pad 236 and drain pad 244 remains covered by insulation layer 270.

In FIG. 6b, an electrically conductive layer 278 is formed over and conformally applied to source pad 236 and drain pad 244 and over a portion of insulation layer 270 by using a patterning and metal deposition process such as printing, PVD, CVD, sputtering, electrolytic plating, and electroless plating. In one embodiment, wafer 120 is immersed into an electroless nickel plating solution and nickel is plated on source pad 236 and drain pad 244 to a thickness of 3 μm. Alternatively, conductive layer 278 can be one or more layers of Al, Cu, Sn, Au, Ag, or other suitable electrically conductive material. Conductive layer 278 extends across a top portion of, and follows the contours of, the top surface of insulation layer 270, along a side wall of insulation layer 270 at a periphery of opening 272, and across the top surface of source pad 236 and drain pad 244 within opening 272. Conductive layer 278 includes an area 280 that is within a footprint of opening 272 and over source pad 236 and drain pad 244. Area 280 is substantially flat and is smaller than an entire area of source pad 236 and drain pad 244, respectively. Conductive layer 278 operates as a first UBM layer for a later formed bump.

Figure 6C:
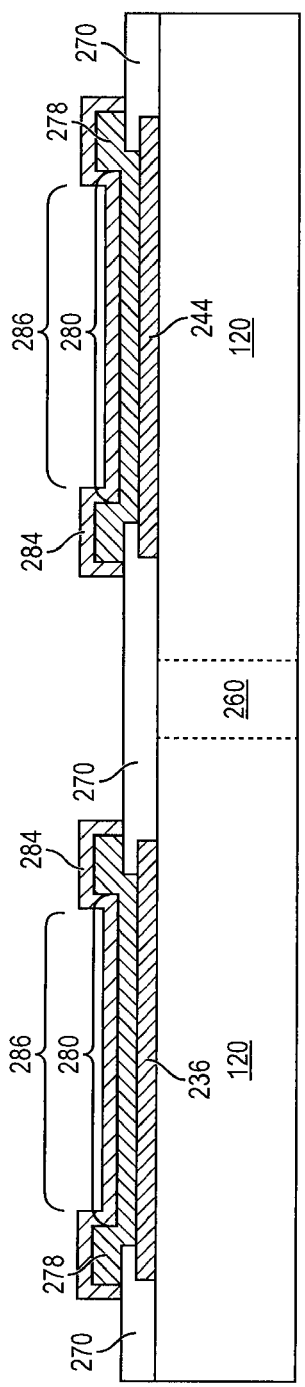

In FIG. 6c, an electrically conductive layer 284 is formed over and conformally applied to conductive layer 278 using a deposition process such as electroless plating or a patterning and metal deposition process such as printing, PVD, CVD, sputtering, and electrolytic plating. In one embodiment, wafer 120 is immersed into an electroless gold plating solution and a layer of gold with a thickness of approximately 100 angstroms is plated on the exposed metal regions of conductive layer 278 with an electroless plating process. In another embodiment, the layer of gold is plated with a thickness of 10-300 angstroms. Alternatively, conductive layer 284 can be one or more layers of Al, Cu, Sn, Ni, Ag, or other suitable electrically conductive material. Conductive layer 284 follows the contours of conductive layer 278 across the surfaces of conductive layer 278 exposed from insulation layer 270, source pad 236, and drain pad 244. Conductive layer 284 extends across sidewalls of conductive layer 278 from insulation layer 270 to, and across, a top surface of insulation layer 270 and into and across area 280 of conductive layer 278. A top surface of conductive layer 284 includes an area 286 that is substantially flat, formed over source pad 236 and drain pad 244, and is both smaller than, and included within a footprint of, area 280. Conductive layer 284 acts as a second UBM layer that serves as an adhesion layer to aid in the later attachment of a conductive bump to conductive layer 278, source pad 236, and drain pad 244. While the use of conductive layers 278 and 284 is a low cost method of forming a UBM, other methods may also be used to form a UBM over source pad 236 and drain pad 244 to aid in the later attachment of a conductive bump.

Figure 6D:
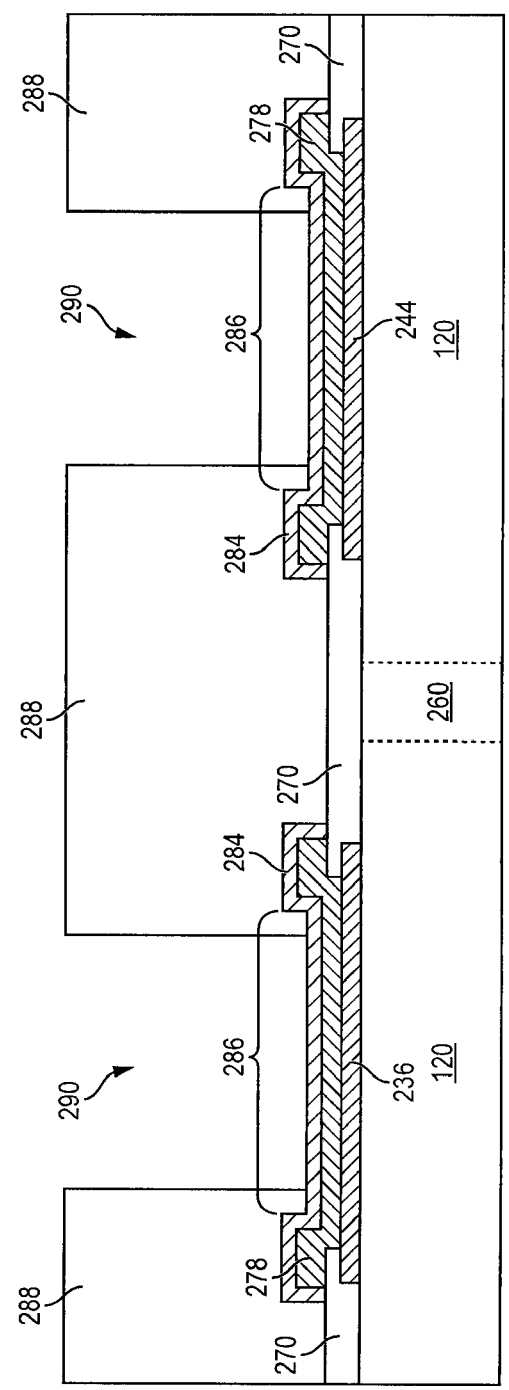

In FIG. 6d, a stencil or masking layer 288 with openings 290 is disposed over wafer 120 such that openings 290 align with and expose central portions of areas 286. Stencil 288 includes a rigid body with a solid surface and is made of metal or other suitable material. Stencil 288 is disposed over an entirety of wafer 120 and includes openings 290 which are formed by a laser or cutting tool at desired locations to align with UBM sites configured to receive later formed bumps. Openings 290 are aligned over a central portion of areas 286 such that a portion of stencil 288 is disposed over a peripheral portion of conductive layers 278 and 284 to separate openings 290 from passivation layer 270. By separating openings 290 and passivation layer 270, later formed conductive material is prevented from spreading or flowing under passivation layer 270. Openings 290 have a height and width formed to contain a predetermined volume of a later deposited conductive paste according to the design and function of the semiconductor package. Accordingly, the volume of later deposited conductive material on area 286 is determined by a thickness of the stencil and a cross sectional area or aperture size of openings 290. In one embodiment, openings 290 have a circular cross sectional area configured to form conductive bumps with a cylindrical shape including a short height and a circular cross section. In another embodiment, openings 290 have a width less than 270 μm which is less than the width of opening 272 in insulation layer 270.

Figure 6E:
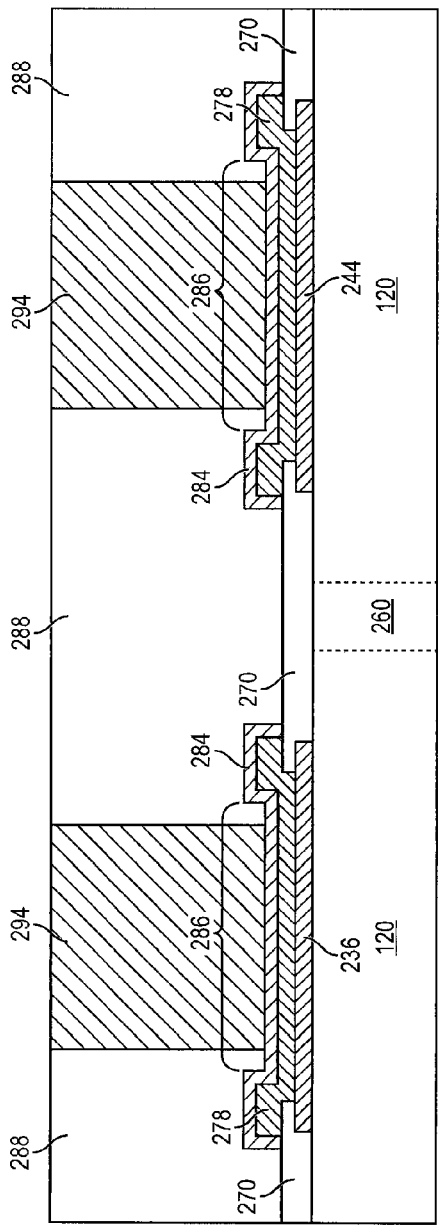

In FIG. 6e, an electrically conductive bump material 294 is deposited within openings 290 and over a central portion of area 286. Conductive bump material 294 can be Al, Sn, Ni, Au, Ag, Pb, bismuth (Bi), Cu, indium (In), solder, and combinations thereof, with an optional flux solution. For example, the bump material can be eutectic Sn/Pb, high-lead solder, or lead-free solder. Conductive bump material 294 is deposited by stenciling the bump material onto conductive layer 284 within openings 290. Stenciling is accomplished by using an object such as a squeegee to force quantities of bump material 294 into openings 290 as the object moves across a top surface of stencil 288. Stenciling is also accomplished by spraying, painting, or brushing conductive bump material 294 into openings 290 within stencil 288. Alternatively, conductive bump material 294 can be injected into openings 290. By stenciling conductive bump material 294 onto wafer 120 and over MOSFET cells 124, rather than stenciling conductive paste onto a circuit board, a correct location for conductive bump material 294 is provided such that the bump material for forming conductive bumps over a semiconductor die can be deposited for the entire semiconductor wafer 120 in a single step. Furthermore, a volume of conductive bump material 294 deposited on conductive layer 284 is controlled by a thickness of stencil 288 and a cross sectional area or aperture size of opening 290, thereby controlling a final size of the later formed conductive bump.

Figure 6F:
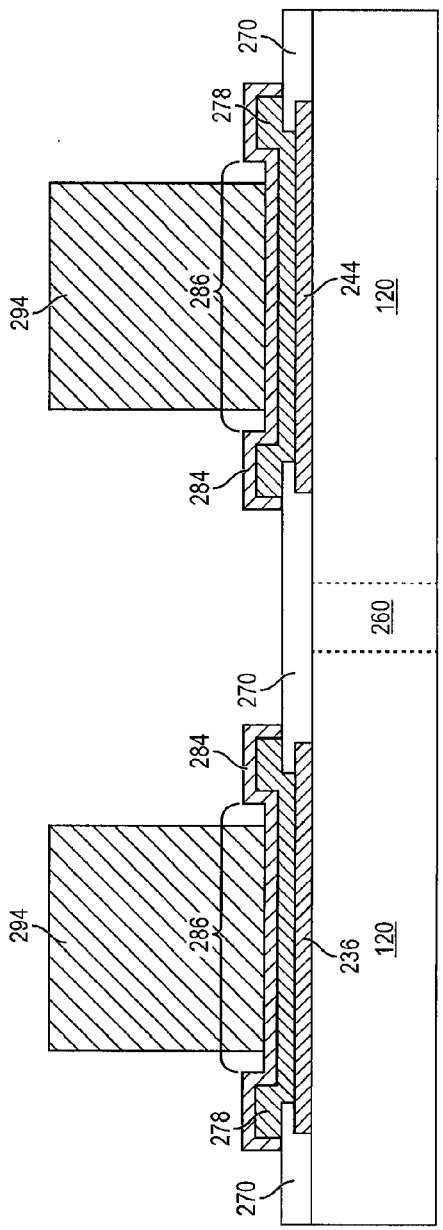

In FIG. 6f, stencil 288 is removed from over wafer 120 leaving a volume of conductive bump material 294 on a central portion of area 286 and over conductive layers 278, 284, source pad 236, and drain pad 244. The resulting volume of solder material that remains over conductive layers 278, 284, source pad 236, and drain pad 244 will be less than a volume of conductive material from a preformed solder ball used in a ball drop process that has a predetermined diameter corresponding to a width of source pad 236 and drain pad 244.

Figure 6G:
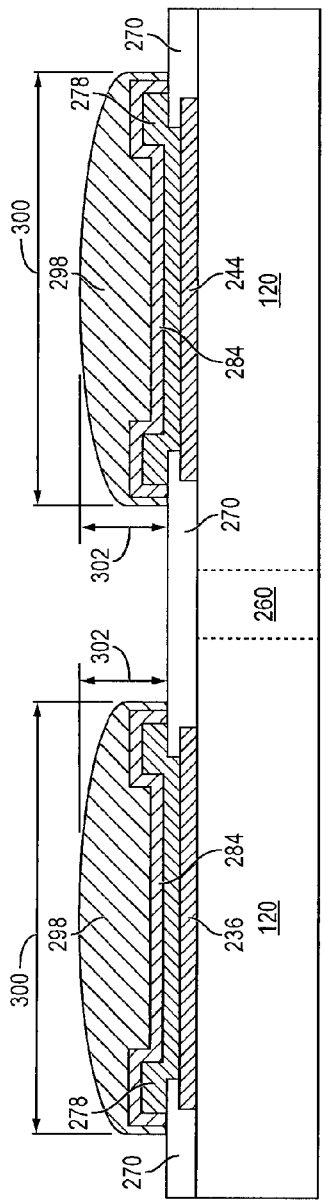

In FIG. 6g, the conductive bump material 294 is reflowed by heating the material above its melting point to form a short conductive bump 298. In some applications, bump 298 is reflowed multiple times to improve electrical and mechanical connections including contact with conductive layers 278 and 284. Subsequent reflows of bumps 298 further include: reflowing bumps 298 while connected to MOSFET cell 124 in order to connect MOSFET cell 124 and bumps 298 to a later provided substrate, reflowing bumps 298 when mounting MOSFET cell 124 to an additional later provided substrate or multilayered PCB, and reflowing bumps 298 for the mounting of additional components to, or rework of, the additional later provided substrate or multi-layered PCB. When reflowing conductive paste 294, the conductive paste travels outward from the central portion of area 286 and contacts a sidewall of conductive layer 284 at a periphery of the conductive layer and contacts a portion of insulation layer 270 adjacent to the periphery of conductive layer 284. The spreading of conductive paste 294 from a first width substantially equal to a width of opening 290 to a second width substantially equal to a width of conductive layer 284 results in short conductive bump 298. Bump 298 has a rounded profile with a width that is greater than a width of conductive paste 294 and a height that is less than a height of the conductive paste deposited in opening 290. In one embodiment, conductive bumps 298 have a width 300 of approximately 300 μm, a spacing between bumps of approximately 200 μm, and a pitch of approximately 500 μm. However, the pitch of openings 290 and the corresponding pitch of bumps 298 can be made much smaller. Additionally, bumps 298 have a height 302 of approximately 70 μm. The resulting short bump 298 has a wider contact area over source pad 236 and drain pad 244 than a contact area of a preformed spherical solder ball of substantially equal height. Similarly, short bump 298 has a height, e.g., 70 μm, which is substantially smaller than a preformed spherical ball with a similar width, e.g., 300 μm. Accordingly, the configuration of bumps 298 provides improved flow of electrical current with respect to preformed spherical solder balls of substantially similar height.

Figure 6H:
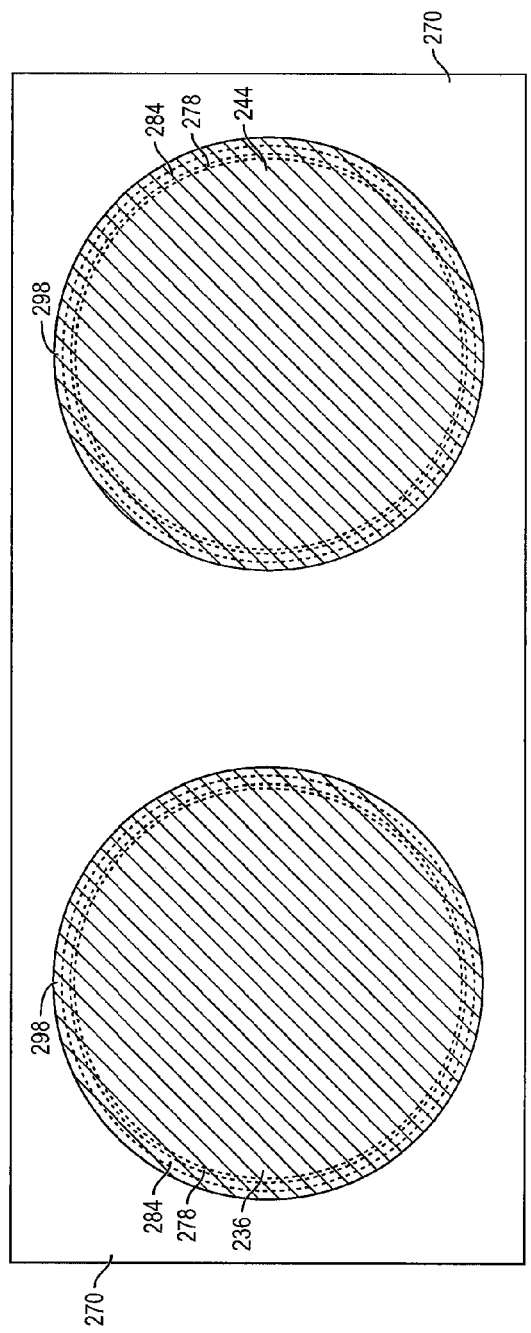

FIG. 6h shows a plan or top view of short bumps 298 formed over source pad 236 and drain pad 244, insulation layer 270, conductive layer 278, and conductive layer 284. As noted above, in one embodiment source pad 236, drain pad 244, conductive layer 278, and conductive layer 284 have circular cross sections such that reflowed bumps 298 include a cylindrical shape having a short height and a circular cross section.

Figure 6I:
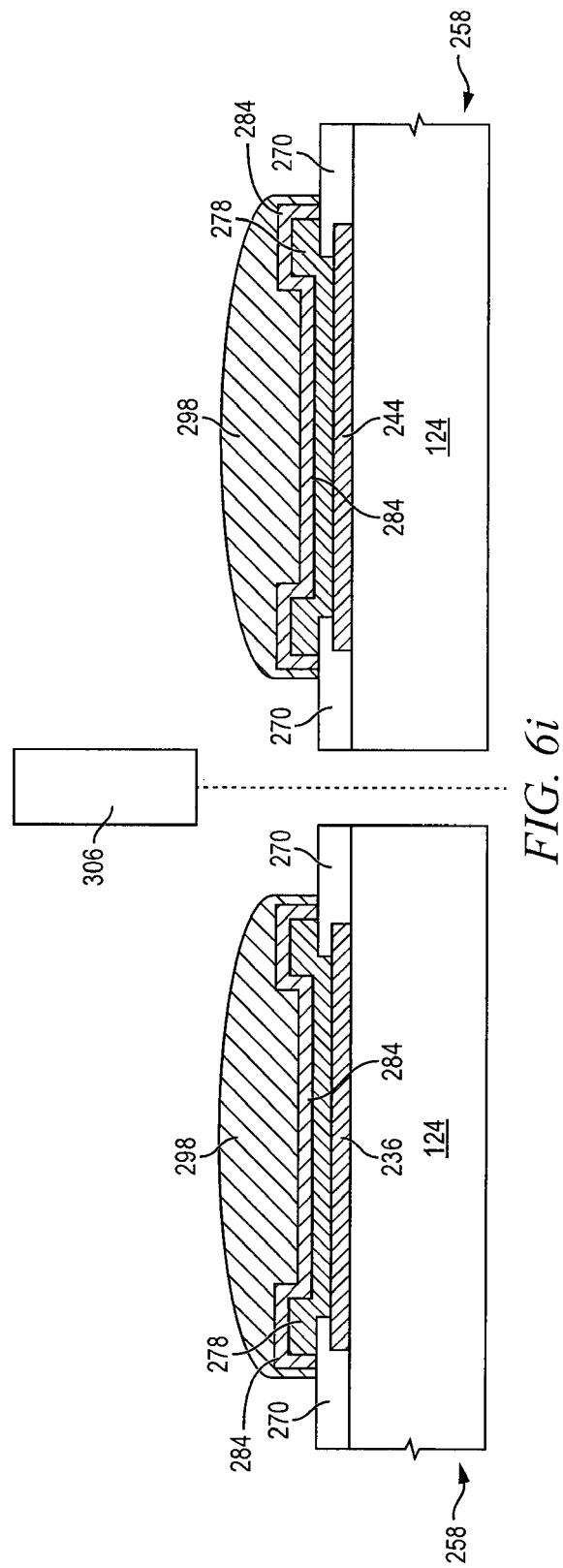

In FIG. 6i, semiconductor wafer 120 is singulated through saw streets 260 with saw or laser cutting tool 306 to form individual power MOSFETs 258 with a plurality of short bumps 298.

Figure 7A:
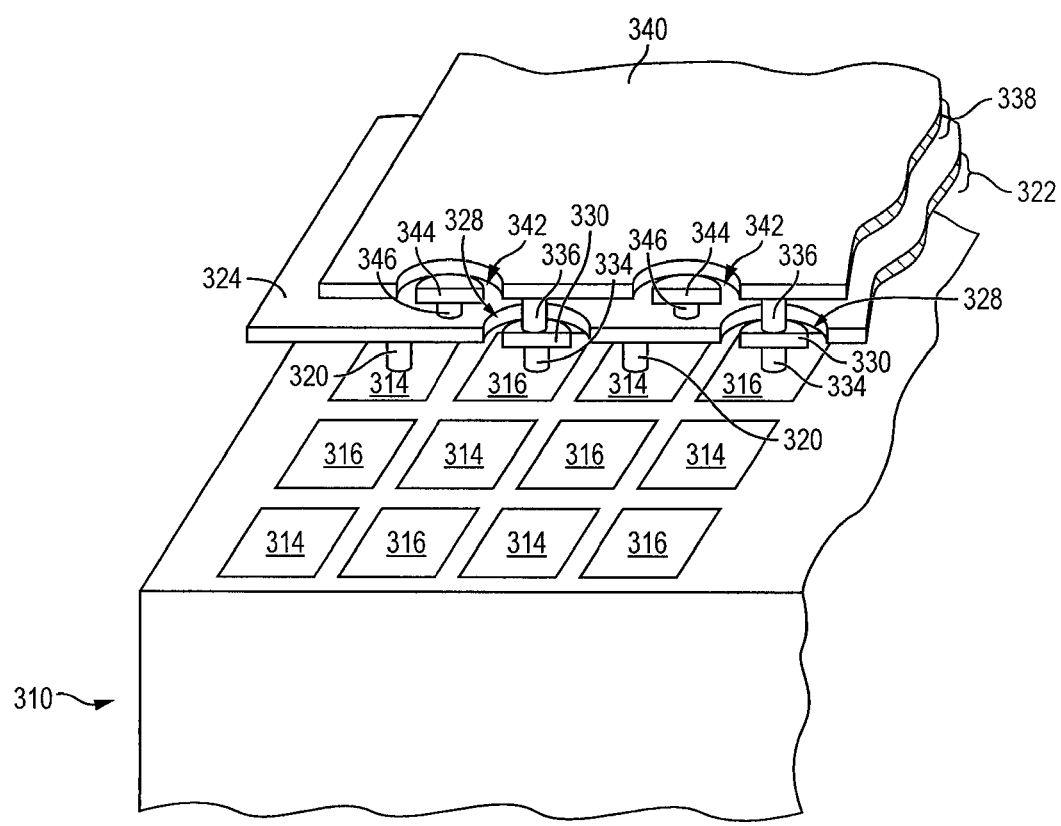
FIGS. 7a-7c illustrate further detail of a power MOSFET with an interconnect structure.

FIG. 7a shows another embodiment of the present invention, similar to the embodiment shown in FIGS. 4a-4t. FIG. 7a shows an isometric three dimensional view of MOSFET cell 310. MOSFET cell 310 includes source regions 314 and drain regions 316 similar to source regions 160 and drain regions 170 shown in FIG. 4t. However, source regions 314 and drain regions 316 are shown configured in a "checkerboard" pattern across MOSFET cell 310 rather than as "stripes" as shown in FIG. 4t.

Conductive vias 320 are formed over source regions 314 and include W, Al, Cu, Sn, Ni, Au, Ag, Ti, polysilicon, or other suitable electrically conductive material, using PVD, CVD, electrolytic plating, electroless plating process, or other suitable metal deposition process. Conductive vias 320 provide electrical connection from source regions 314 to a first interconnect layer 322.

The first interconnect layer 322 is formed over MOSFET cell 310, over conductive vias 320, and over drain regions 316. First interconnect layer 322 includes a conductive plane 324, that further includes openings or cutouts 328 and connections 330. Conductive plane 324 is one or more layers of Cu, Sn, Ni, NiV, Au, Ag, Al or other suitable conductive material. Conductive plane 324 is patterned and deposited using electrolytic plating, electroless plating, sputtering, PVD, CVD, or other suitable metal deposition process. Conductive plane 324 electrically connects to source regions 314 through conductive vias 320, and operates as a source connection layer. Openings 328 in conductive plane 324 are formed by removal of a portion of the conductive plane. By removing a portion of conductive plane 324 in a periphery of connection 300, connection 300 is electrically isolated with respect to the conductive plane 324, and is configured for subsequent vertical electrical connections to pass from above first interconnect layer 322 to below the first interconnect layer without contacting conductive plane 324.

Conductive vias 334 are formed over drain regions 316 and include W, Al, Cu, Sn, Ni, Au, Ag, Ti, polysilicon, or other suitable electrically conductive material, using PVD, CVD, electrolytic plating, electroless plating process, or other suitable metal deposition process. Conductive vias 334 provide electrical connection from drain regions 316 to connections 330. Similarly, conductive vias 336 are formed over connections 330 and include W, Al, Cu, Sn, Ni, Au, Ag, Ti, polysilicon, or other suitable electrically conductive material, using PVD, CVD, electrolytic plating, electroless plating process, or other suitable metal deposition process. Conductive vias 336 provide electrical connection from connections 330 to second interconnect layer 338.

The second interconnect layer 338 is formed over MOSFET cell 310, over source regions 314 and drain regions 316, over conductive vias 320, 334, and 336, and over connections 330. Second interconnect layer 338 includes a conductive plane 340, the conductive plane further includes openings 342 and connections 344. Conductive plane 340 is one or more layers of Cu, Sn, Ni, NiV, Au, Ag, Al or other suitable conductive material. Conductive plane 340 is patterned and deposited using electrolytic plating, electroless plating, sputtering, PVD, CVD, or other suitable metal deposition process. Conductive plane 340 electrically connects to drain regions 316 through conductive vias 334, connections 330, conductive vias 336, and operates as a drain connection layer. Openings 342 in conductive plane 340 are formed by removal a portion of the conductive plane. By removing a portion of conductive plane 340 in a periphery of connection 344, connection 344 is electrically isolated with respect to conductive plane 340, and is configured for subsequent vertical electrical connections to pass from above second interconnect layer 340 to below the second interconnect layer without contacting conductive plane 340.

Conductive vias 346 are formed over first interconnect layer 322 and include W, Al, Cu, Sn, Ni, Au, Ag, Ti, polysilicon, or other suitable electrically conductive material, using PVD, CVD, electrolytic plating, electroless plating process, or other suitable metal deposition process. Conductive vias 346 are electrically connected to connections 344, and to source regions 314 through conductive vias 320 and conductive plane 324. Connections 344 are further electrically connected to a third interconnect layer.

The third interconnect layer, similar to source pad 236 shown as a third interconnect layer in FIGS. 4r and 4s, is formed over MOSFET cell 310, over source regions 314 and drain regions 316, over conductive vias 320, 334, 336, and 346, over connections 330 and 344, and over first and second interconnect layers 322 and 338. The third interconnect layer includes a source pad that is one or more layers of Cu, Sn, Ni, NiV, Au, Ag, Al or other suitable conductive material. The source pad is patterned and deposited using electrolytic plating, electroless plating, sputtering, PVD, CVD, or other suitable metal deposition process. The source pad is configured to be connected to a later formed source bump which provides electrical connection between drain region 316 and devices external to MOSFET cell 310.

An electrically conductive bump material is deposited over the source pad to form a source bump or interconnect, as described above in FIGS. 6a-6i. The drain bump provides electrical connection from drain region 316 to devices external to MOSFET cell 310. The source bump represents one type of interconnect structure that can be formed over the source pad. The source bump or interconnect can also use bond wires, conductive paste, stud bump, micro bump, or other electrical interconnect.

Figure 7B:
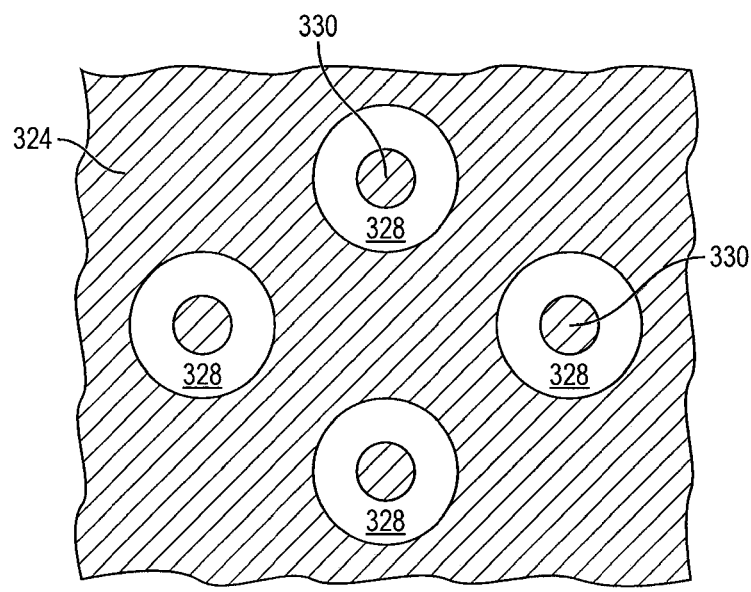

FIG. 7b shows a top plan view of conductive plane 324 with openings 328 to electrically connect drain regions 316 to conductive vias 334, connections 330, conductive vias 336, and conductive plane 340.

Figure 7C:
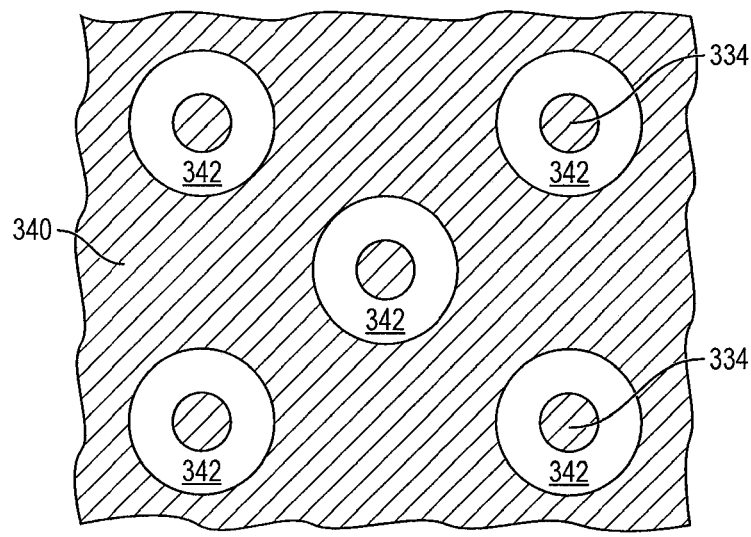

FIG. 7c shows a top plan view of conductive plane 340 with openings 342 to electrically connect source regions 314 to conductive vias 320, conductive plane 324, conductive via 346, and connections 344.

Figure 8:
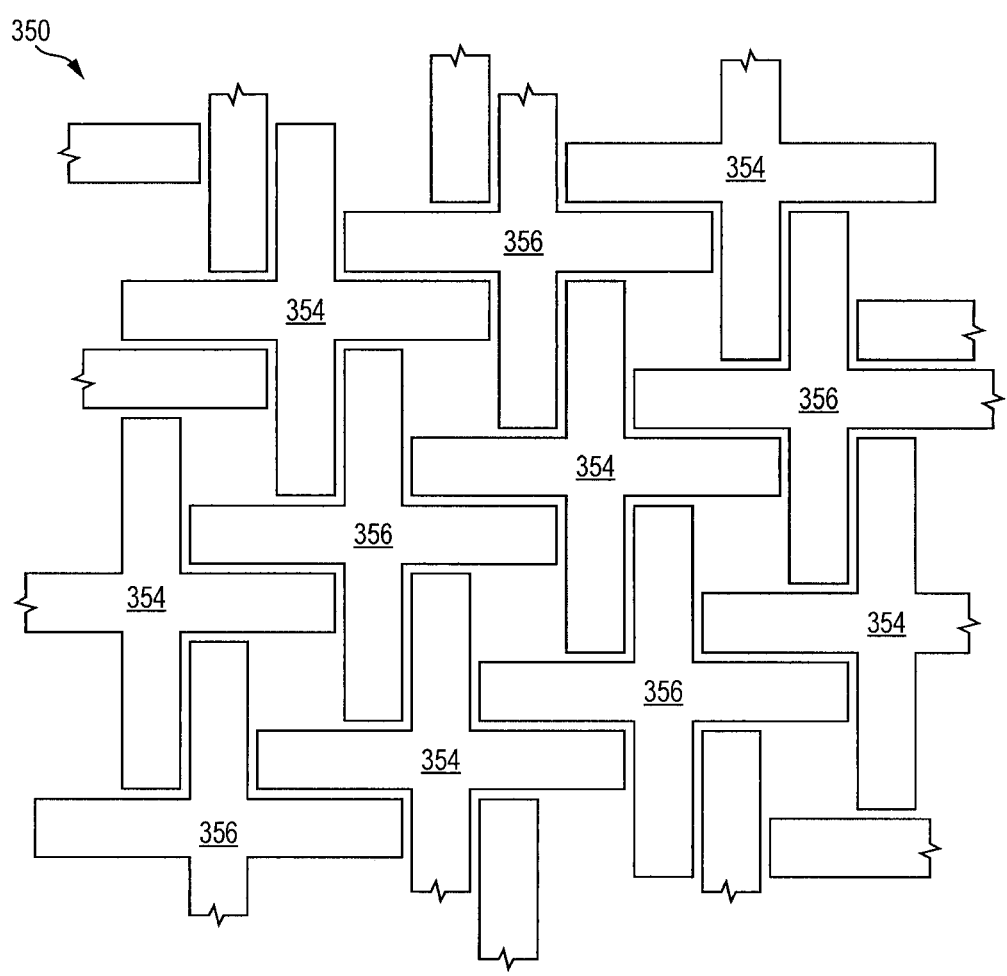
FIG. 8 illustrates further detail of a power MOSFET interconnect structure.

FIG. 8 shows another embodiment of the present invention, similar to the embodiments shown in FIGS. 4a-4t, and FIGS. 7a-7c. FIG. 8 shows a top plan view of an interconnect layer 350, similar to interconnect layers disposed at interconnect levels 194, 214, and 234 in FIGS. 4l-4t, and interconnect layers 322 and 338 in FIGS. 7a-7c. Each interconnect layer 350 includes source runners or conductive layers 354 and drain runners or conductive layers 356. Source runners 354 and drain runners 356 can be one or more layers, and can be Cu, Sn, Ni, NiV, Au, Ag, Al or other suitable conductive material. Source runners 354 and drain runners 356 are patterned and deposited using electrolytic plating, electroless plating, sputtering, PVD, CVD, or other suitable metal deposition process. Source runners 354 and drain runners 356 are cross-shape (+) and establish electrical connections with adjacent source regions, drain regions, or adjacent interconnect layers. Source runners 354 and drain runners 356 may be of shapes other than a cross-shape (+), such as an L-shape (L) and a T-shape (T).

Source runners 354 and drain runners 356 are arranged in a repeating pattern having a constant pitch, or distance between center points of adjacent runners. Similarly, additional structures connected to source runners 354 and drain runners 356, such as conductive vias and source bumps, or other interconnect layers, are also arranged in a repeating pattern having a constant pitch between center points. The repeating interleaved or alternating intervals at which source runners 354 and drain runners 356 are oriented produce a unit structure distributed over the surface of a semiconductor wafer over which the source and drain runners are formed.

Each interconnect layer 350 can be used as a first, second, third, or other interconnect level. More than two or three interconnect layers may be used, and intermediate interconnect layers can be formed between first and second interconnect layers, or between second and third interconnect layers. Additional intermediate interconnect layers assist in the routing of electrical signals and decrease the pitch of source and drain bumps or interconnects. As a first interconnect level, interconnect level 350 is electrically connected to conductive vias and to source and drain regions. Source runners 354 and drain runners 356 electrically connect any desired number of chip-side conductive elements. In one embodiment, the cross shaped runners are electrically connected to conductive vias that contact a group of five source or drain regions. One via is located at a center of the cross shaped runner where the two orthogonal portions of the cross overlap, and four vias are located at the four distal ends of the cross shaped runners. Source runners 354 and drain runners 356 electrically connect to source regions and drain regions, respectively. Alternatively, source runners 354 and drain runners 356 need not connect source and drain regions of an integrated device, but in another embodiment can electrically connect to various discrete components. As a second interconnect level, interconnect level 350 is formed over source and drain regions, over conductive pillars, and over first interconnect layer. As a second interconnect level, interconnect level 350 can also be disposed under conductive vias, under a third interconnect level, and under a later formed bump which provides electrical connection to devices external the MOSFET cell. As a third interconnect level, interconnect level 350 is configured to be connected to later formed source and drain bumps or interconnects, as shown for example in FIGS. 6a-6i, which provide electrical connection between the second interconnect layer and devices external the MOSFET cell. In one embodiment, source and drain bumps from FIGS. 6a-6i are attached at the center of the cross-shape (+) source runners 354 and drain runners 356. Source and drain bumps or interconnects also include bond wires, conductive paste, stud bump, micro bump, or other electrical interconnect.

Figure 9:
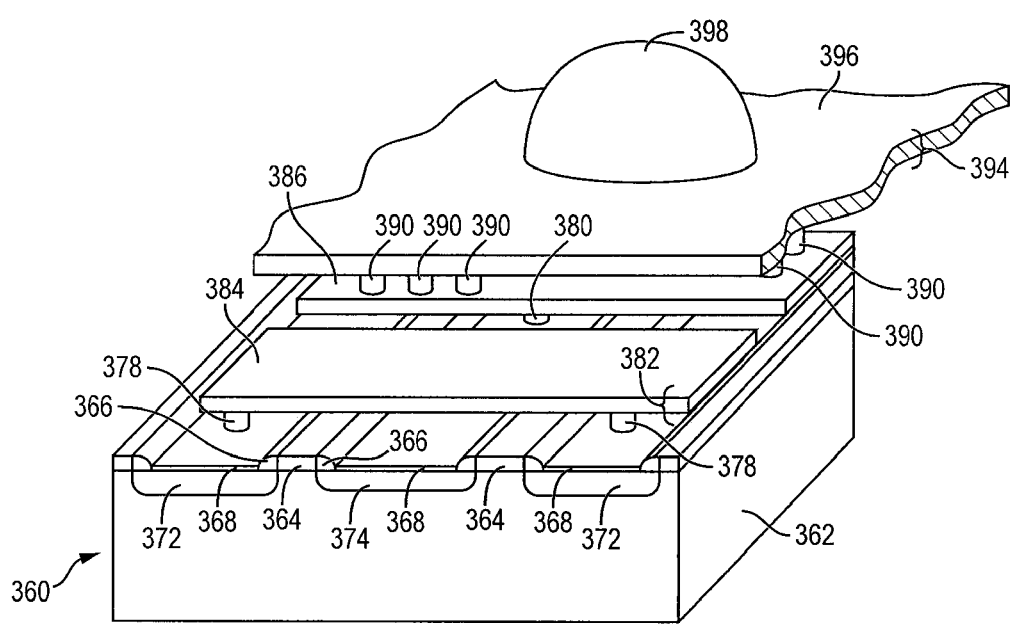
FIG. 9 illustrates further detail of a power MOSFET with an interconnect structure.

FIG. 9 shows another embodiment of the present invention, similar to the embodiment shown in FIGS. 4a-4t, FIGS. 7a-7c, and FIG. 8. FIG. 9 shows an isometric three dimensional view of MOSFET cell 360. MOSFET cell 360 includes source region 372 and drain region 374 similar to source region 160 and drain region 170 shown, e.g., in FIG. 4t. A polysilicon layer 364, similar to polysilicon layer 138 from FIG. 4d, is formed over semiconductor wafer 362. A portion of polysilicon layer 364 is removed by an etching process and a remaining portion of polysilicon layer 364, shown in FIG. 9, serves as a gate for transistors within MOSFET cell 360. An insulation layer 366, similar to insulation layer 150 from FIG. 4h, is formed around polysilicon layer 364 and extends over a portion of source region 372 and drain region 374. A silicide layer 368, similar to a silicide layer 174 in FIG. 4j, is formed as a thin layer over source region 372 and drain region 374.

Conductive vias 378 are formed over source region 372 and conductive vias 380 are formed over drain region 374. Conductive vias 378 and 380 include W, Al, Cu, Sn, Ni, Au, Ag, Ti, polysilicon, or other suitable electrically conductive material, and are formed using PVD, CVD, electrolytic plating, electroless plating process, or other suitable metal deposition process. Conductive vias 378 and 380 provide electrical connection from source region 372 and drain region 374, respectively, to a first interconnect layer 382.

First interconnect layer 382 is formed over MOSFET cell 360, over conductive vias 378 and 380, and over source region 372 and drain region 374. First interconnect layer 382 includes source runners or conductive layers 384, and drain runners or conductive layers 386, similar to source runners 196 and drain runners 198 from FIG. 4l and similar to source runners 216 and drain runners 218 from FIG. 4o. Source runners 384 are formed over, and electrically connected to, source region 372 with conductive vias 378. Drain runners 386 are formed over, and electrically connected to, drain region 374 with conductive vias 380. Source runners 384 are also electrically connected to conductive vias formed over source runners 384, similar to conductive vias 226 shown in FIG. 4r. Drain runners 386 are also electrically connected to conductive vias 390, formed over drain runners 386 and electrically connected to a second interconnect layer 394.

The second interconnect layer 394, similar to source pad 236 shown as a third interconnect layer in FIGS. 4r and 4s, is formed over MOSFET cell 360. The second interconnect layer 394 is also formed over source region 372 and drain region 374, over conductive vias 378, 380, and 390, and over the first interconnect layer 382 including source runners 384 and drain runners 386. FIG. 9 shows second interconnect layer 394 formed as drain pad 396 that is connected to drain bump 398 to provide electrical connection between drain region 374 and devices external to MOSFET cell 360. Drain bump 398 is formed over drain pad 396 as described above in FIGS. 6a-6i. The drain bump provides electrical connection from drain region 374 to devices external to MOSFET cell 360. The drain bump represents one type of interconnect structure that can be formed over drain pad 396. The source bump or interconnect 398 also includes bond wires, conductive paste, stud bump, micro bump, or other electrical interconnect.

Figure 10A:
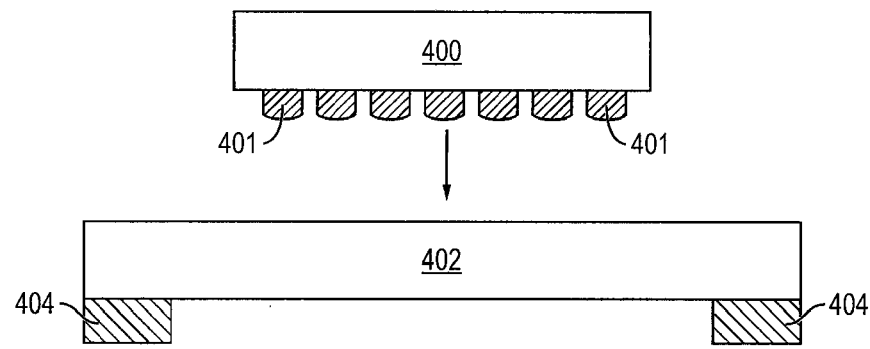
FIGS. 10a-10b illustrate a power MOSFET with a short UBM structure mounted to a substrate without underfill material.

FIG. 10a shows singulated power MOSFET cell 400, similar to power MOSFET 258 from FIGS. 5a and 6i, or power MOSFET 259 from FIG. 5b, with short conductive bumps 401 being mounted to a substrate or multilayered PCB 402 with bumps 401 oriented toward the substrate. Substrate 402 provides general structural support and electrical interconnect for power MOSFET 400 when the power MOSFET is mounted to the substrate. Substrate 402 further includes conductive contacts 404.

Figure 1B:
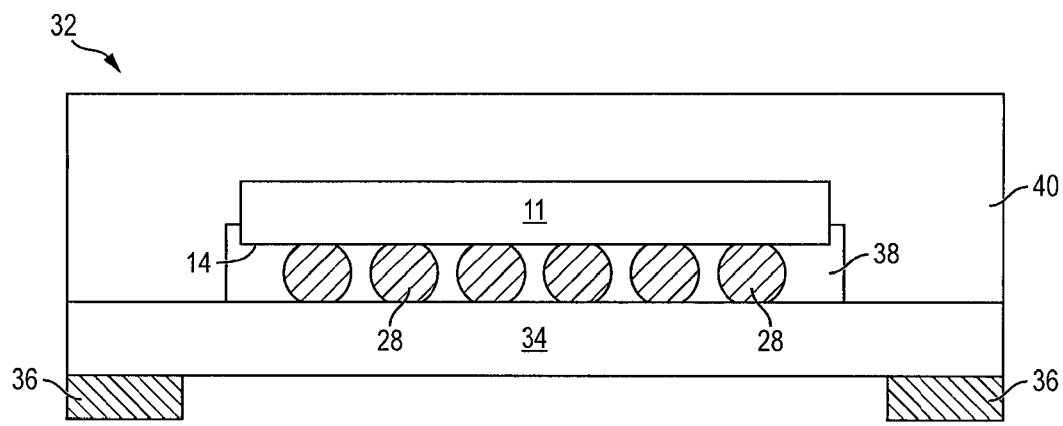
Figure 10B:
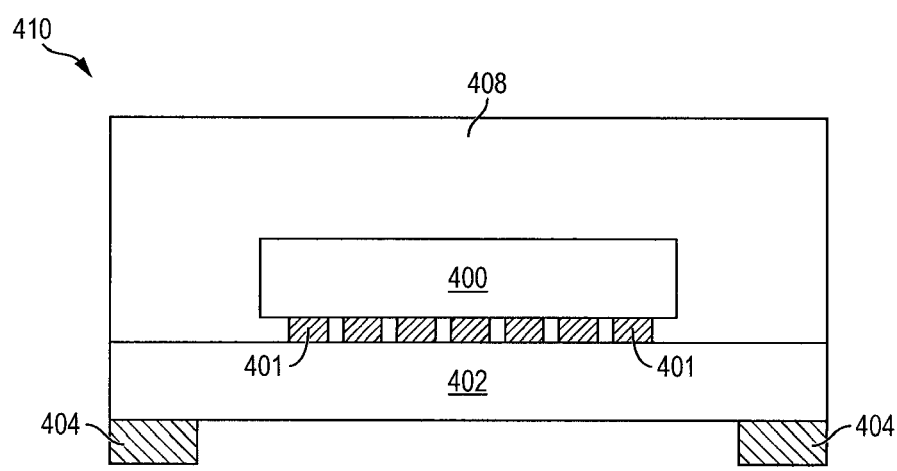

In FIG. 10b, power MOSFET 400 is mounted to substrate 402. No underfill material is deposited around bumps 401 or between substrate 402 and power MOSFET 400. Bumps 401 undergo multiple reflows to improve electrical and mechanical connections. The multiple reflows of bumps 401 include reflowing bumps 401 for connecting the bumps to power MOSFET 400, reflowing bumps 401 while connected to power MOSFET 400 to connect power MOSFET 400 and bumps 401 to substrate 402, reflowing bumps 401 when mounting substrate 402 to an additional substrate or multi-layered PCB, and reflowing bumps 401 for the mounting of additional components to, or rework of, the additional substrate or multi-layered PCB. Significantly, a risk of bumps 401 bridging and electrically shorting, even without an underfill material, is reduced due to the reduced height of bumps 401 with respect to traditional spherical bumps like bumps 28 shown in FIG. 1b. The reduced volume of bump material present in bumps 401 tends to stay in place over UBM layers during reflow without spreading to contact other bumps and causing electrical shorting. Therefore, the need for underfill material is reduced and the difficulty of underfill material causing semiconductor die cracking and failure is mitigated.

Encapsulant 408 is formed over substrate 402, and over and around power MOSFET 400 using a paste printing, compressive molding, transfer molding, liquid encapsulant molding, vacuum lamination, or other suitable applicator. Encapsulant 408 can be polymer composite material, such as epoxy resin with filler, epoxy acrylate with filler, or polymer with proper filler. Encapsulant 408 is non-conductive, provides physical support, and environmentally protects power MOSFET 400 from external elements and contaminants. A portion of encapsulant 408 extends at least partially between power MOSFET 400 and substrate 402, especially near a perimeter of power MOSFET 400. Encapsulant 408 can also extend completely under power MOSFET 400 to completely fill the void between power MOSFET 400 and substrate 402. A risk of power MOSFET 400 shifting due to placement of encapsulant 408 is reduced due to the reduced height and low profile of bumps 401. Additionally, the problem of mechanical, thermal, and chemical stresses caused by non-uniform underfill material is not present with a uniformly deposited encapsulant. The configuration of package 410, including power MOSFET 400 mounted to substrate 402 with short conductive bump 401, creates a shorter electrical path between the transistors of power MOSFET 400 and substrate 402 than with traditional spherical bumps. The shorter electrical path results in lower resistance and less inductance, especially with high frequency applications. The shorter electrical path also results in increased thermal performance of power MOSFET 400 due to the reduced standoff height between the power MOSFET and substrate 402 that allows heat from the power MOSFET to be transferred to the substrate more readily. Therefore, the configuration of package 410, including the attachment of power MOSFET to a substrate with short conductive bumps without underfill molding, reduces the problem of solder bridging and shorting among bumps while maintaining robust electrical connections thereby increasing yield and reliability.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
   providing a substrate;
   forming a source region on a first surface of the substrate;
   forming a drain region on the first surface of the substrate;
   forming a gate between the source region and drain region;
   depositing a metal over the source region and drain region to form a silicide layer over the source region and drain region;
   forming a first interconnect layer over the silicide layer including a first runner connected to the source region and second runner connected to the drain region, the first interconnect layer connected to the silicide layer through a conductive via;
   forming a second interconnect layer over the first interconnect layer, the second interconnect layer including a third runner connected to the first runner and a fourth runner connected to the second runner;
   forming an under bump metallization (UBM) over and electrically connected to the second interconnect layer;
   disposing a mask over the substrate with an opening in the mask aligned over the UBM including a portion of the mask disposed over a sidewall of the UBM;
   depositing a conductive bump material within the opening;
   removing the mask; and
   reflowing the conductive bump material to form a bump, the bump including a height less than a height of the bump material within the opening in the mask with a portion of the bump contacting the sidewall of the UBM.

2. The method of claim 1, further including forming the first runner and second runner parallel with respect to each other and orthogonal with respect to the source region and drain region.

3. The method of claim 1, further including forming the third runner and fourth runner parallel with respect to each other and orthogonal with respect to the first runner and second runner.

4. The method of claim 1, further including:
   forming the source region as a first stripe extending across the first surface of the substrate; and
   forming the drain region as a second stripe extending across the first surface of the substrate parallel to the source region.

5. The method of claim 1, further including connecting the source region and drain region to a plurality of electrical paths such that electrical current will flow along an electrical path including a minimum of resistance.

6. The method of claim 1, wherein the first runner, second runner, third runner, and fourth runner include a rectangular-shape, cross-shape (+), L-shape (L), or T-shape (T).

* * * * *